(12) United States Patent
Shahbazi Mirzahasanloo et al.

(10) Patent No.: US 10,586,546 B2
(45) Date of Patent: Mar. 10, 2020

(54) INVERSELY ENUMERATED PYRAMID VECTOR QUANTIZERS FOR EFFICIENT RATE ADAPTATION IN AUDIO CODING

(71) Applicant: QUALCOMM Incorporated, San Diego, CA (US)

(72) Inventors: Taher Shahbazi Mirzahasanloo, San Diego, CA (US); Walter Andres Zuluaga, San Diego, CA (US); Rogerio Guedes Alves, Macomb Township, MI (US)

(73) Assignee: Qualcomm Incorporated, San Diego, CA (US)

( * ) Notice: Subject to any disclaimer, the term of this patent is extended or adjusted under 35 U.S.C. 154(b) by 28 days.

(21) Appl. No.: 16/050,894

(22) Filed: Jul. 31, 2018

(65) Prior Publication Data
US 2019/0333527 A1   Oct. 31, 2019

Related U.S. Application Data

(60) Provisional application No. 62/663,088, filed on Apr. 26, 2018.

(51) Int. Cl.
*G10L 19/038* (2013.01)
*H04W 84/12* (2009.01)
(Continued)

(52) U.S. Cl.
CPC ............ *G10L 19/038* (2013.01); *H04R 3/005* (2013.01); *H04W 84/12* (2013.01); *G10L 19/002* (2013.01); *H03M 7/3082* (2013.01)

(58) Field of Classification Search
CPC . G10L 19/038; G10L 19/002; G10L 19/0204; G10L 19/035; G10L 19/24; H03M 7/3082
See application file for complete search history.

(56) References Cited

U.S. PATENT DOCUMENTS

| 5,150,387 A | 9/1992 | Yoshikawa et al. |
| 5,241,535 A | 8/1993 | Yoshikawa |

(Continued)

FOREIGN PATENT DOCUMENTS

| CN | 101145787 A | 3/2008 |
| WO | 2015162500 A2 | 10/2015 |

OTHER PUBLICATIONS

"Bluetooth Core Specification v 5.0," published Dec. 6, 2016 accessed from https://www.bluetooth.com/ specifications, 5 pp.
(Continued)

*Primary Examiner* — Thomas H Maung
(74) *Attorney, Agent, or Firm* — Shumaker & Sieffert, P.A.

(57) ABSTRACT

An example apparatus includes a memory configured to store the audio data; and one or more processors in communication with the memory, the one or more processors configured to: decode, from an encoded audio bitstream, a unique identifier for each of a plurality of subbands of audio data; perform inverse pyramid vector quantization (PVQ) using a compact map to reconstruct a residual vector for each subband of the plurality of subbands of the audio data based on the unique identifier for the respective subband of the plurality of subbands of the audio data, wherein the compact map is generated using structural unification of vectors across subbands and relational compression, and wherein the unique identifiers correspond to codevectors; and reconstruct, based on the residual vectors and energy scalars for each subband, the plurality of subbands of the audio data.

25 Claims, 16 Drawing Sheets

(51) Int. Cl.
*H04R 3/00* (2006.01)
*H03M 7/30* (2006.01)
*G10L 19/002* (2013.01)

(56) References Cited

U.S. PATENT DOCUMENTS

| | | |
|---|---|---|
| 5,594,833 A | 1/1997 | Miyazawa et al. |
| 6,263,312 B1 | 7/2001 | Kolesnik et al. |
| 6,567,781 B1 | 5/2003 | Lafe |
| 6,574,593 B1 | 6/2003 | Gao et al. |
| 6,725,192 B1 | 4/2004 | Araki |
| 6,735,339 B1 | 5/2004 | Ubale |
| 7,139,702 B2 | 11/2006 | Tsushima et al. |
| 7,499,898 B1 | 3/2009 | Owen et al. |
| 7,617,096 B2 | 11/2009 | Thyssen |
| 7,689,427 B2 | 3/2010 | Vasilache |
| 7,702,514 B2 | 4/2010 | Lin et al. |
| 7,904,293 B2 | 3/2011 | Wang et al. |
| 8,396,163 B2 | 3/2013 | Collings et al. |
| 8,620,673 B2 | 12/2013 | Zhang et al. |
| 8,694,325 B2 | 4/2014 | Lin et al. |
| 9,015,052 B2 | 4/2015 | Lin et al. |
| 9,159,331 B2 | 10/2015 | Kim et al. |
| 9,263,050 B2 | 2/2016 | Daniel et al. |
| 9,546,924 B2 | 1/2017 | Grancharov et al. |
| 9,754,594 B2 | 9/2017 | Liu et al. |
| 9,972,334 B2 | 5/2018 | Subasingha et al. |
| 10,032,281 B1 | 7/2018 | Ghesu et al. |
| 2001/0049598 A1 | 12/2001 | Das |
| 2002/0111704 A1 | 8/2002 | Suzuki |
| 2004/0002859 A1 | 1/2004 | Liu et al. |
| 2005/0165611 A1 | 7/2005 | Mehrotra et al. |
| 2006/0270347 A1 | 11/2006 | Ibrahim et al. |
| 2007/0016414 A1 | 1/2007 | Mehrotra et al. |
| 2007/0033057 A1 | 2/2007 | Covell et al. |
| 2007/0093206 A1 | 4/2007 | Desai et al. |
| 2007/0094019 A1 | 4/2007 | Nurminen |
| 2007/0198256 A1 | 8/2007 | Hu et al. |
| 2007/0286524 A1 | 12/2007 | Song |
| 2009/0006103 A1 | 1/2009 | Koishida et al. |
| 2010/0174531 A1 | 7/2010 | Bernard Vos |
| 2011/0178807 A1 | 7/2011 | Yang et al. |
| 2012/0226505 A1* | 9/2012 | Lin .................. G10L 19/002 704/500 |
| 2012/0232908 A1* | 9/2012 | Terriberry ........... G10L 19/022 704/500 |
| 2012/0232913 A1* | 9/2012 | Terriberry ........... G10L 19/038 704/503 |
| 2012/0259644 A1 | 10/2012 | Lin et al. |
| 2012/0296658 A1 | 11/2012 | Smyth |
| 2012/0323582 A1 | 12/2012 | Peng et al. |
| 2013/0060365 A1 | 3/2013 | Jeong et al. |
| 2013/0080157 A1 | 3/2013 | Kim et al. |
| 2013/0275140 A1 | 10/2013 | Kim et al. |
| 2013/0332177 A1 | 12/2013 | Helmrich et al. |
| 2014/0039890 A1 | 2/2014 | Mundt et al. |
| 2014/0046670 A1 | 2/2014 | Moon et al. |
| 2014/0052439 A1 | 2/2014 | Rose et al. |
| 2014/0052678 A1 | 2/2014 | Martinez et al. |
| 2014/0156284 A1 | 6/2014 | Porov et al. |
| 2015/0073784 A1 | 3/2015 | Gao |
| 2015/0317991 A1 | 11/2015 | Liu et al. |
| 2016/0027449 A1 | 1/2016 | Svedberg |
| 2016/0088297 A1 | 3/2016 | Svedberg |
| 2016/0142845 A1 | 5/2016 | Dick et al. |
| 2016/0189722 A1 | 6/2016 | Nagisetty et al. |
| 2016/0232908 A1 | 8/2016 | Fuchs et al. |
| 2016/0232910 A1 | 8/2016 | Fischer et al. |
| 2016/0254004 A1 | 9/2016 | Norvell et al. |
| 2016/0275955 A1 | 9/2016 | Liu et al. |
| 2016/0307578 A1 | 10/2016 | Rose et al. |
| 2017/0069328 A1 | 3/2017 | Kawashima et al. |
| 2017/0084280 A1 | 3/2017 | Srinivasan et al. |
| 2017/0147949 A1 | 5/2017 | Uchibe et al. |
| 2017/0148460 A1 | 5/2017 | Atti et al. |
| 2017/0213151 A1 | 7/2017 | Uchibe et al. |
| 2017/0215019 A1 | 7/2017 | Chen et al. |
| 2017/0223356 A1 | 8/2017 | Sung et al. |
| 2017/0228655 A1 | 8/2017 | Alarie et al. |
| 2017/0301359 A1 | 10/2017 | Svedberg |
| 2017/0365260 A1 | 12/2017 | Chebiyyam et al. |
| 2018/0060023 A1 | 3/2018 | Nemer et al. |
| 2018/0061428 A1 | 3/2018 | Seroussi et al. |
| 2018/0182400 A1 | 6/2018 | Choo et al. |
| 2018/0288182 A1 | 10/2018 | Tong et al. |
| 2018/0374495 A1 | 12/2018 | Fienberg et al. |
| 2019/0156844 A1 | 5/2019 | Fischer et al. |
| 2019/0230438 A1 | 7/2019 | Hatab et al. |

OTHER PUBLICATIONS

"Advanced Audio Distribution Profile Specification," version 1.3.1, published Jul. 14, 2015, 35 pp.

Hung, et al., "Error-resilient pyramid vector quantization for image compression," IEEE Transactions on Image Processing, vol. 7, No. 10, Oct. 1998, pp. 1373-1386.

Chou, et al., "Vertex Data Compression through Vector Quantization," IEEE Transactions on Visualization and Computer Graphics, vol. 8, No. 4, Oct.-Dec. 2002, pp. 373-382.

"MDCT Audio Coding with Pulse Vector Quantizers," accessed from https://www.ericsson.com/assets/local/publications/conference-papers/mdct_audio_coding_with_pulse_vector_quantizers.pdf, 5 pp.

"Chapter 13: Policy Gradient Methods," Reinforcement Learning: An Introduction, second edition, pp. 323-340.

Fischer, "A pyramid vector quantizer," IEEE Transactions on Information Theory, vol. 32 No. 4, Jul. 1986, pp. 568-583.

Hong, "Unsupervised Feature Selection Using Clustering Ensembles and Population Based Incremental Learning Algorithm," Dec. 20, 2007, 32 pp.

Bishop, "Pattern Recognition and Machine Learning" Information Science and Statistics, published Apr. 2011, 758 pp.

U.S. Appl. No. 16/050,844, filed by Taher Shahbazi Mirzahasanloo et al., [Qualcomm, Inc.], filed Jul. 31, 2018.

U.S. Appl. No. 16/050,966, filed by Taher Shahbazi Mirzahasanloo et al., [Qualcomm, Inc.], filed Jul. 31, 2018.

U.S. Appl. No. 16/051,007, filed by Taher Shahbazi Mirzahasanloo et al., [Qualcomm, Inc.], filed Jul. 31, 2018.

* cited by examiner

US 10,586,546 B2

INVERSELY ENUMERATED PYRAMID VECTOR QUANTIZERS FOR EFFICIENT RATE ADAPTATION IN AUDIO CODING

This application claims the benefit of U.S. Provisional Application No. 62/663,088, filed Apr. 26, 2018, the entire content of which is incorporated by reference herein.

TECHNICAL FIELD

This disclosure relates to audio encoding and decoding.

BACKGROUND

Wireless networks for short-range communication, which may be referred to as "personal area networks," are established to facilitate communication between a source device and a sink device. One example of a personal area network (PAN) protocol is Bluetooth®, which is often used to form a PAN for streaming audio data from the source device (e.g., a mobile phone) to the sink device (e.g., headphones or a speaker).

In some examples, the Bluetooth® protocol is used for streaming encoded or otherwise compressed audio data. In some examples, audio data is encoded using gain-shape vector quantization audio encoding techniques. In gain-shape vector quantization audio encoding, audio data is transformed into the frequency domain and then separated into subbands of transform coefficients. A scalar energy level (e.g., gain) of each subband is encoded separately from the shape (e.g., a residual vector of transform coefficients) of the subband.

SUMMARY

In general, this disclosure relates to techniques for reducing the storage requirements of pyramid vector quantization (PVQ). PVQ is used in compression of different forms of media such as audio and video. To perform PVQ, an audio encoder may map a residual vector to a vector of quantized integers over a hyperspace defined by the PVQ. The audio encoder then performs enumeration to assign a unique ID to each codevector on the hyperspace. Enumeration is a lossless process and IDs are created in a way to uniquely identify any codevector in the codebook.

The mapping of a vector may be parameterized by N and K. N represents the number of samples in the vector to be quantized and K represents the number of pulses to be included on the N-dimensional hypersurface. Each combination of N (number of coefficients/dimensions) and K (number of pulses) may be represented by a V-value (also referred to as a V-table, V-representation, or V-vector). These V-values may require a large amount of table memory. As such, it would be desirable for an audio encoder (and an audio decoder) to not have to explicitly store all of the V-values.

In accordance with one or more techniques of this disclosure, as opposed to explicitly storing all of the V-values, an audio coder (i.e., an audio encoder or an audio decoder) may store a compact map and use the compact map to generate V-values as needed. The compact map may be generated using a combination of structural unification and relational compression.

In this respect, the techniques may include a method of encoding audio data, the method comprising separating audio data into a plurality of subbands; generating, for each subband, a respective energy scalar and a respective residual vector; perform pyramid vector quantization (PVQ) using a compact map to generate a unique identifier for the residual vector in each subband, wherein the compact map is generated using structural unification of vectors across subbands and relational compression; and encoding, in a bitstream, the generated unique identifier for each subband.

As another example, a method for decoding audio data includes decoding, from an encoded audio bitstream, a unique identifier for each of a plurality of subbands of audio data; performing inverse pyramid vector quantization (PVQ) using a compact map to reconstruct a residual vector for each subband based on the unique identifier for the subband, wherein the compact map is generated using structural unification of vectors across subbands and relational compression; and reconstructing, based on the residual vectors and energy scalars for each subband, the audio data of the subbands.

The details of one or more aspects of the techniques are set forth in the accompanying drawings and the description below. Other features, objects, and advantages of these techniques will be apparent from the description and drawings, and from the claims.

DETAILED DESCRIPTION

Figure 1:
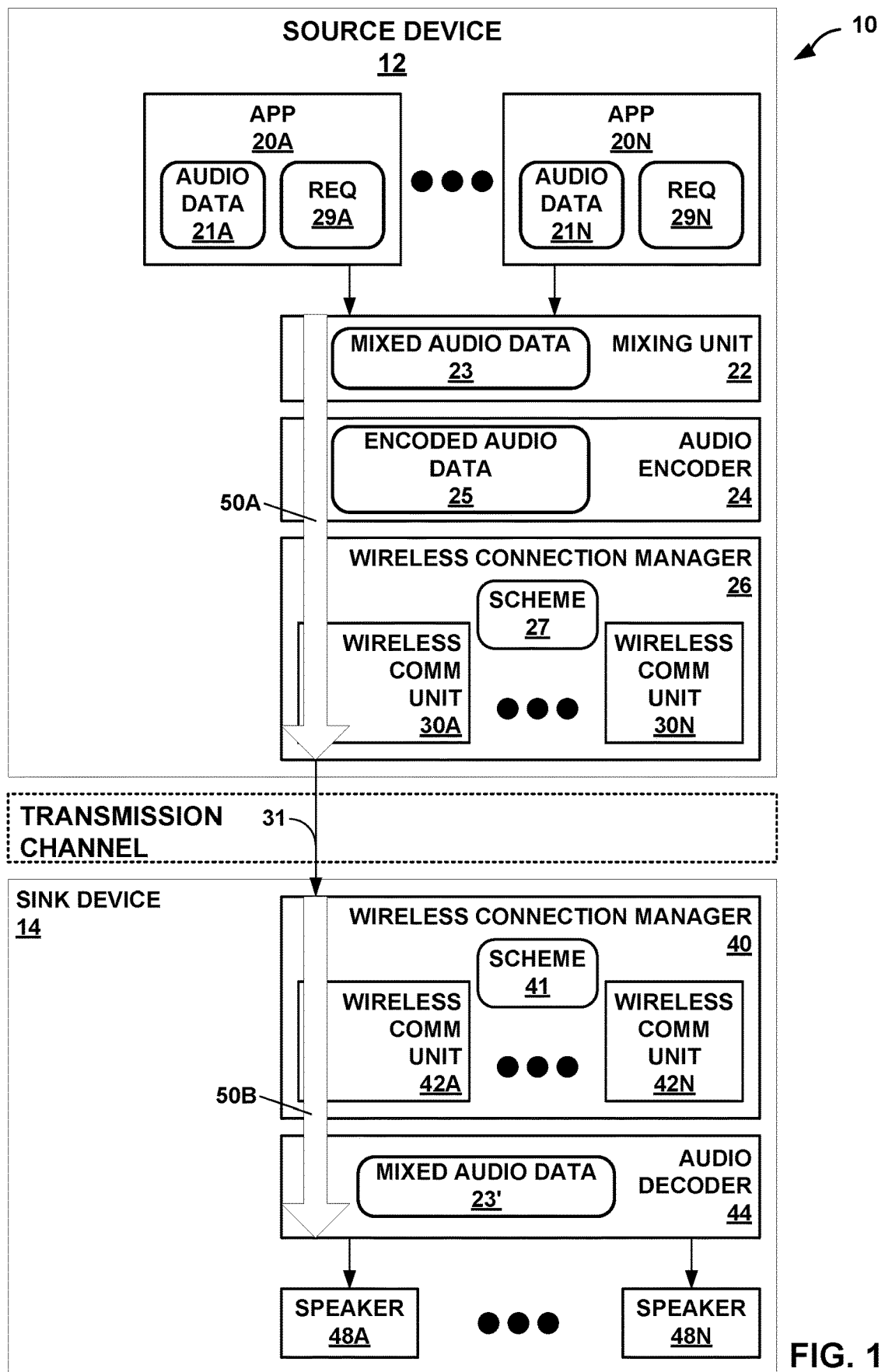
FIG. 1 is a block diagram illustrating a system that may perform various aspects of the techniques described in this disclosure.

In general, this disclosure relates to techniques for reducing the storage requirements of pyramid vector quantization (PVQ), and its computational complexity. As discussed above, the mapping of a vector may be parameterized by N and K. N represents the number of samples in the vector to be quantized and K represents the number of pulses to be included on the N-dimensional hypersurface. Each combination of N (number of coefficients/dimensions) and K (number of pulses) may be represented by a V-value (also referred to as a V-table, V-representation, or V-vector). For example, if P(N,K) is an N-dimensional hyper-pyramid with K number of pulses and V(N,K) is a number of vectors with integer components lying on P(N,K), then:

$$P(N, K) = \left\{ x: \sum_{i=1}^{N} |x_i| = K \right\}$$

$$V(N, K) = \begin{cases} \text{the number of veectors } x \text{ such that} \\ \sum_{i=1}^{N} |x_i| = K, \text{ and } x_i \text{ is an integer for } i = 1, \ldots, N \end{cases}$$

These V-values may require a large amount of table memory. For example, explicit storage of V-values for 28 subbands may require ~11,302 kB. Larger values of N (i.e., higher dimensions) may cause the storage requirements to grow very quickly. As such, it would be desirable for an audio encoder (and an audio decoder) to not have to explicitly store all of the V-values.

In accordance with one or more techniques of this disclosure, as opposed to explicitly storing all of the V-values, an audio coder (i.e., an audio encoder or an audio decoder) may store a compact map and use the compact map to generate V-values as needed. The compact map may be generated using a combination of structural unification and relational compression.

To perform structural unification, the audio encoder may generate a plurality of unified vectors. As different numbers of coefficients will point to different V-values with different dimensions, hashing can be used to represent data. As such, multiple subbands may be mapped to one unified vector (that is the value of the hash). By generating the unified vectors from all of the different subbands, the audio encoder may remove redundancy between the subbands. For instance, the encoder may perform hashing to generate 6 or 7 unified vectors from 28 subbands.

To preform relational compression, the audio encoder may perform inter-vector or intra-vector compression on the unified vectors. This may result in additional storage savings over just using the unified vectors.

To perform inter-vector compression, the audio encoder may assume a base vector and formulate the remaining vectors as functions of the base vector. As such, to store vectors compressed using inter-vector compression, the audio encoder may explicitly store a base vector and functions that may be applied to the base vector (or other vector generated based on the base vector) to generate vectors.

To perform intra-vector compression, the audio encoder may assume a base vector and generate difference values between subsequent vectors. For instance, as opposed to storing $\{V_1, V_2, \text{ and } V_3\}$, the audio encoder may store $\{V_1, \Delta V_1, \text{ and } \Delta V_2\}$ where $V_2 = \Delta V_1 + V_1$ and $V_3 = \Delta V_2 + V_2$, which is be less than the storage required for the uncompressed vectors.

FIG. 1 is a diagram illustrating a system 10 that may perform various aspects of the techniques described in this disclosure for extended-range coarse-fine quantization of audio data. As shown in the example of FIG. 1, the system 10 includes a source device 12 and a sink device 14. Although described with respect to the source device 12 and the sink device 14, the source device 12 may operate, in some instances, as the sink device, and the sink device 14 may, in these and other instances, operate as the source device. As such, the example of system 10 shown in FIG. 1 is merely one example illustrative of various aspects of the techniques described in this disclosure.

In any event, the source device 12 may represent any form of computing device capable of implementing the techniques described in this disclosure, including a handset (or cellular phone), a tablet computer, a so-called smart phone, a remotely piloted aircraft (such as a so-called "drone"), a robot, a desktop computer, a receiver (such as an audio/visual—AV—receiver), a set-top box, a television (including so-called "smart televisions"), a media player (such as s digital video disc player, a streaming media player, a Blue-Ray Disc™ player, etc.), or any other device capable of communicating audio data wirelessly to a sink device via a personal area network (PAN). For purposes of illustration, the source device 12 is assumed to represent a smart phone.

The sink device 14 may represent any form of computing device capable of implementing the techniques described in this disclosure, including a handset (or cellular phone), a tablet computer, a smart phone, a desktop computer, a wireless headset (which may include wireless headphones that include or exclude a microphone, and so-called smart wireless headphones that include additional functionality such as fitness monitoring, on-board music storage and/or playback, dedicated cellular capabilities, etc.), a wireless speaker (including a so-called "smart speaker"), a watch (including so-called "smart watches"), or any other device capable of reproducing a soundfield based on audio data communicated wirelessly via the PAN. Also, for purposes of illustration, the sink device 14 is assumed to represent wireless headphones.

As shown in the example of FIG. 1, the source device 12 includes one or more applications ("apps") 20A-20N ("apps 20"), a mixing unit 22, an audio encoder 24, and a wireless connection manager 26. Although not shown in the example of FIG. 1, the source device 12 may include a number of other elements that support operation of apps 20, including an operating system, various hardware and/or software interfaces (such as user interfaces, including graphical user interfaces), one or more processors, memory, storage devices, and the like.

Each of the apps 20 represent software (such as a collection of instructions stored to a non-transitory computer readable media) that configure the system 10 to provide some functionality when executed by the one or more processors of the source device 12. The apps 20 may, to list a few examples, provide messaging functionality (such as access to emails, text messaging, and/or video messaging), voice calling functionality, video conferencing functionality, calendar functionality, audio streaming functionality, direction functionality, mapping functionality, gaming functionality. Apps 20 may be first party applications designed and developed by the same company that designs and sells the operating system executed by the source device 12 (and often pre-installed on the source device 12) or third-party applications accessible via a so-called "app store" or possibly pre-installed on the source device 12. Each of the apps 20, when executed, may output audio data 21A-21N ("audio data 21"), respectively. In some examples, the audio data 21 may be generated from a microphone (not pictured) connected to the source device 12.

The mixing unit 22 represents a unit configured to mix one or more of audio data 21A-21N ("audio data 21") output by the apps 20 (and other audio data output by the operating system—such as alerts or other tones, including keyboard press tones, ringtones, etc.) to generate mixed audio data 23. Audio mixing may refer to a process whereby multiple sounds (as set forth in the audio data 21) are combined into one or more channels. During mixing, the mixing unit 22 may also manipulate and/or enhance volume levels (which may also be referred to as "gain levels"), frequency content, and/or panoramic position of the audio data 21. In the context of streaming the audio data 21 over a wireless PAN session, the mixing unit 22 may output the mixed audio data 23 to the audio encoder 24.

The audio encoder 24 may represent a unit configured to encode the mixed audio data 23 and thereby obtain encoded audio data 25. In some examples, the audio encoder 24 may encode individual ones of the audio data 21. Referring for purposes of illustration to one example of the PAN protocols, Bluetooth® provides for a number of different types of audio codecs (which is a word resulting from combining the words "encoding" and "decoding") and is extensible to include vendor specific audio codecs. The Advanced Audio Distribution Profile (A2DP) of Bluetooth® indicates that support for A2DP requires supporting a subband codec specified in A2DP. A2DP also supports codecs set forth in MPEG-1 Part 3 (MP2), MPEG-2 Part 3 (MP3), MPEG-2 Part 7 (advanced audio coding—AAC), MPEG-4 Part 3 (high efficiency-AAC—HE-AAC), and Adaptive Transform Acoustic Coding (ATRAC). Furthermore, as noted above, A2DP of Bluetooth® supports vendor specific codecs, such as aptX™ and various other versions of aptX (e.g., enhanced aptX—E-aptX, aptX live, and aptX high definition—aptX-HD).

The audio encoder 24 may operate consistent with one or more of any of the above listed audio codecs, as well as, audio codecs not listed above, but that operate to encode the mixed audio data 23 to obtain the encoded audio data 25. The audio encoder 24 may output the encoded audio data 25 to one of the wireless communication units 30 (e.g., the wireless communication unit 30A) managed by the wireless connection manager 26. In accordance with example techniques of this disclosure that will be described in more detail below, the audio encoder 24 may be configured to encode the audio data 21 and/or the mixed audio data 23 using a compact map.

The wireless connection manager 26 may represent a unit configured to allocate bandwidth within certain frequencies of the available spectrum to the different ones of the wireless communication units 30. For example, the Bluetooth® communication protocols operate over within the 2.5 GHz range of the spectrum, which overlaps with the range of the spectrum used by various WLAN communication protocols. The wireless connection manager 26 may allocate some portion of the bandwidth during a given time to the Bluetooth® protocol and different portions of the bandwidth during a different time to the overlapping WLAN protocols. The allocation of bandwidth and other is defined by a scheme 27. The wireless connection manager 40 may expose various application programmer interfaces (APIs) by which to adjust the allocation of bandwidth and other aspects of the communication protocols so as to achieve a specified quality of service (QoS). That is, the wireless connection manager 40 may provide the API to adjust the scheme 27 by which to control operation of the wireless communication units 30 to achieve the specified QoS.

In other words, the wireless connection manager 26 may manage coexistence of multiple wireless communication units 30 that operate within the same spectrum, such as certain WLAN communication protocols and some PAN protocols as discussed above. The wireless connection manager 26 may include a coexistence scheme 27 (shown in FIG. 1 as "scheme 27") that indicates when (e.g., an interval) and how many packets each of the wireless communication units 30 may send, the size of the packets sent, and the like.

The wireless communication units 30 may each represent a wireless communication unit 30 that operates in accordance with one or more communication protocols to communicate encoded audio data 25 via a transmission channel to the sink device 14. In the example of FIG. 1, the wireless communication unit 30A is assumed for purposes of illustration to operate in accordance with the Bluetooth® suite of communication protocols. It is further assumed that the wireless communication unit 30A operates in accordance with A2DP to establish a PAN link (over the transmission channel) to allow for delivery of the encoded audio data 25 from the source device 12 to the sink device 14.

More information concerning the Bluetooth® suite of communication protocols can be found in a document entitled "Bluetooth Core Specification v 5.0," published Dec. 6, 2016, and available at: www.bluetooth.org/en-us/specification/adopted-specifications. More information concerning A2DP can be found in a document entitled "Advanced Audio Distribution Profile Specification," version 1.3.1, published on Jul. 14, 2015.

The wireless communication unit 30A may output the encoded audio data 25 as a bitstream 31 to the sink device 14 via a transmission channel, which may be a wired or wireless channel, a data storage device, or the like. While shown in FIG. 1 as being directly transmitted to the sink device 14, the source device 12 may output the bitstream 31 to an intermediate device positioned between the source device 12 and the sink device 14. The intermediate device may store the bitstream 31 for later delivery to the sink device 14, which may request the bitstream 31. The intermediate device may comprise a file server, a web server, a desktop computer, a laptop computer, a tablet computer, a mobile phone, a smart phone, or any other device capable of storing the bitstream 31 for later retrieval by an audio decoder. This intermediate device may reside in a content delivery network capable of streaming the bitstream 31 (and possibly in conjunction with transmitting a corresponding video data bitstream) to subscribers, such as the sink device 14, requesting the bitstream 31.

Alternatively, the source device 12 may store the bitstream 31 to a storage medium, such as a compact disc, a digital video disc, a high definition video disc or other storage media, most of which are capable of being read by a computer and therefore may be referred to as computer-readable storage media or non-transitory computer-readable storage media. In this context, the transmission channel may refer to those channels by which content stored to these mediums are transmitted (and may include retail stores and other store-based delivery mechanism). In any event, the techniques of this disclosure should not therefore be limited in this respect to the example of FIG. 1.

As further shown in the example of FIG. 1, the sink device 14 includes a wireless connection manager 40 that manages one or more of wireless communication units 42A-42N ("wireless communication units 42") according to a scheme 41, an audio decoder 44, and one or more speakers 48A-48N ("speakers 48"). The wireless connection manager 40 may operate in a manner similar to that described above with respect to the wireless connection manager 26, exposing an API to adjust scheme 41 by which operation of the wireless communication units 42 to achieve a specified QoS.

The wireless communication units 42 may be similar in operation to the wireless communication units 30, except that the wireless communication units 42 operate reciprocally to the wireless communication units 30 to decapsulate the encoded audio data 25. One of the wireless communication units 42 (e.g., the wireless communication unit 42A) is assumed to operate in accordance with the Bluetooth® suite of communication protocols and reciprocal to the wireless communication protocol 28A. The wireless communication unit 42A may output the encoded audio data 25 to the audio decoder 44.

The audio decoder 44 may operate in a manner that is reciprocal to the audio encoder 24. The audio decoder 44 may operate consistent with one or more of any of the above listed audio codecs, as well as, audio codecs not listed above, but that operate to decode the encoded audio data 25 to obtain mixed audio data 23'. The prime designation with respect to "mixed audio data 23" denotes that there may be some loss due to quantization or other lossy operations that occur during encoding by the audio encoder 24. The audio decoder 44 may output the mixed audio data 23' to one or more of the speakers 48.

Each of the speakers 48 represent a transducer configured to reproduce a soundfield from the mixed audio data 23'. The transducer may be integrated within the sink device 14 as shown in the example of FIG. 1 or may be communicatively coupled to the sink device 14 (via a wire or wirelessly). The speakers 48 may represent any form of speaker, such as a loudspeaker, a headphone speaker, or a speaker in an earbud. Furthermore, although described with respect to a transducer, the speakers 48 may represent other forms of speakers, such as the "speakers" used in bone conducting headphones that send vibrations to the upper jaw, which induces sound in the human aural system.

As noted above, the apps 20 may output audio data 21 to the mixing unit 22. Prior to outputting the audio data 21, the apps 20 may interface with the operating system to initialize an audio processing path for output via integrated speakers (not shown in the example of FIG. 1) or a physical connection (such as a mini-stereo audio jack, which is also known as 3.5 millimeter—mm—minijack). As such, the audio processing path may be referred to as a wired audio processing path considering that the integrated speaker is connected by a wired connection similar to that provided by the physical connection via the mini-stereo audio jack. The wired audio processing path may represent hardware or a combination of hardware and software that processes the audio data 21 to achieve a target quality of service (QoS).

To illustrate, one of the apps 20 (which is assumed to be the app 20A for purposes of illustration) may issue, when initializing or reinitializing the wired audio processing path, one or more request 29A for a particular QoS for the audio data 21A output by the app 20A. The request 29A may specify, as a couple of examples, a high latency (that results in high quality) wired audio processing path, a low latency (that may result in lower quality) wired audio processing path, or some intermediate latency wired audio processing path. The high latency wired audio processing path may also be referred to as a high quality wired audio processing path, while the low latency wired audio processing path may also be referred to as a low quality wired audio processing path.

Figure 2:
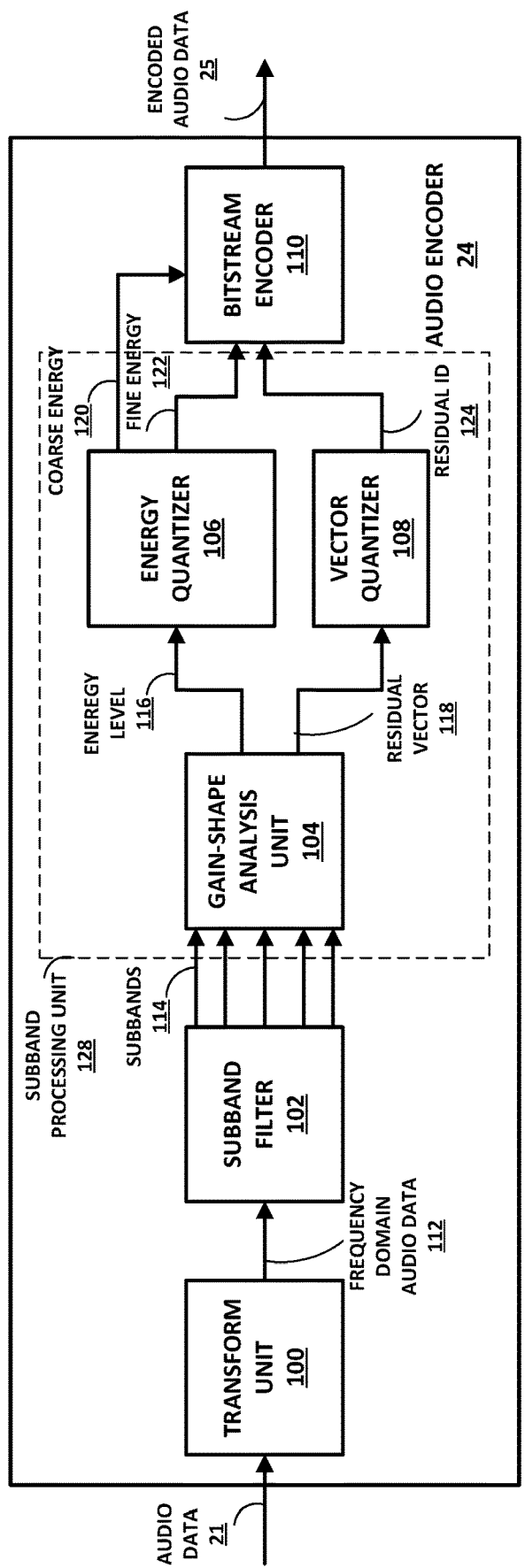
FIG. 2 is a block diagram illustrating an example audio encoder configured to perform various aspects of the techniques described in this disclosure.

FIG. 2 is a block diagram illustrating an example of an audio encoder 24 configured to perform various aspects of the techniques described in this disclosure. The audio encoder 24 may be configured to encode audio data for transmission over a PAN (e.g., Bluetooth®). However, the techniques of this disclosure performed by the audio encoder 24 may be used in any context where the compression of audio data is desired. In some examples, the audio encoder 24 may be configured to encode the audio data 21 in accordance with as aptX™ audio codec, including, e.g., enhanced aptX-E-aptX, aptX live, and aptX high definition. However, the techniques of this disclosure may be used in any audio codec configured to perform pyramid vector quantization (PVQ) of audio data using compact maps. As will be explained in more detail below, the audio encoder 24 may be configured to perform various aspects of a PVQ process using compact maps in accordance with techniques of this disclosure.

In the example of FIG. 2, the audio encoder 24 may be configured to encode the audio data 21 (or the mixed audio data 23) using a gain-shape vector quantization encoding process that includes coding residual vector using compact maps. In a gain-shape vector quantization encoding process, the audio encoder 24 is configured to encode both a gain (e.g., an energy level) and a shape (e.g., a residual vector defined by transform coefficients) of a subband of frequency domain audio data. Each subband of frequency domain audio data represents a certain frequency range of a particular frame of the audio data 21.

The audio data 21 may be sampled at a particular sampling frequency. Example sampling frequencies may include 48 kHz or 44.1 kHZ, though any desired sampling frequency may be used. Each digital sample of the audio data 21 may be defined by a particular input bit depth, e.g., 16 bits or 24 bits. In one example, the audio encoder 24 may be configured operate on a single channel of the audio data 21 (e.g., mono audio). In another example, the audio encoder 24 may be configured to independently encode two or more channels of the audio data 21. For example, the audio data 21 may include left and right channels for stereo audio. In this example, the audio encoder 24 may be configured to encode the left and right audio channels independently in a dual mono mode. In other examples, the audio encoder 24 may be configured to encode two or more channels of the audio data 21 together (e.g., in a joint stereo mode). For example, the audio encoder 24 may perform certain compression operations by predicting one channel of the audio data 21 with another channel of the audio data 21.

Regardless of how the channels of the audio data 21 are arranged, the audio encoder 24 recited the audio data 21 and sends that audio data 21 to a transform unit 100. The transform unit 100 is configured to transform a frame of the audio data 21 from the time domain to the frequency domain to produce frequency domain audio data 112. A frame of the audio data 21 may be represented by a predetermined number of samples of the audio data. In one example, a frame of the audio data 21 may be 1024 samples wide. Different frame widths may be chosen based on the frequency transform being used and the amount of compression desired. The frequency domain audio data 112 may be represented as transform coefficients, where the value of each the transform coefficients represents an energy of the frequency domain audio data 112 at a particular frequency.

In one example, the transform unit 100 may be configured to transform the audio data 21 into the frequency domain audio data 112 using a modified discrete cosine transform (MDCT). An MDCT is a "lapped" transform that is based on a type-IV discrete cosine transform. The MDCT is considered "lapped" as it works on data from multiple frames. That is, in order to perform the transform using an MDCT, transform unit 100 may include a fifty percent overlap window into a subsequent frame of audio data. The overlapped nature of an MDCT may be useful for data compression techniques, such as audio encoding, as it may reduce artifacts from coding at frame boundaries. The transform unit 100 need not be constrained to using an MDCT but may use other frequency domain transformation techniques for transforming the audio data 21 into the frequency domain audio data 112.

A subband filter 102 separates the frequency domain audio data 112 into subbands 114. Each of the subbands 114 includes transform coefficients of the frequency domain audio data 112 in a particular frequency range. For instance, the subband filter 102 may separate the frequency domain audio data 112 into twenty different subbands. In some examples, subband filter 102 may be configured to separate the frequency domain audio data 112 into subbands 114 of uniform frequency ranges. In other examples, subband filter 102 may be configured to separate the frequency domain audio data 112 into subbands 114 of non-uniform frequency ranges.

For example, subband filter 102 may be configured to separate the frequency domain audio data 112 into subbands 114 according to the Bark scale. In general, the subbands of a Bark scale have frequency ranges that are perceptually equal distances. That is, the subbands of the Bark scale are not equal in terms of frequency range, but rather, are equal in terms of human aural perception. In general, subbands at the lower frequencies will have fewer transform coefficients, as lower frequencies are easier to perceive by the human aural system. As such, the frequency domain audio data 112 in lower frequency subbands of the subbands 114 is less compressed by the audio encoder 24, as compared to higher frequency subbands. Likewise, higher frequency subbands of the subbands 114 may include more transform coefficients, as higher frequencies are harder to perceive by the human aural system. As such, the frequency domain audio 112 in data in higher frequency subbands of the subbands 114 may be more compressed by the audio encoder 24, as compared to lower frequency subbands.

The audio encoder 24 may be configured to process each of subbands 114 using a subband processing unit 128. That is, the subband processing unit 128 may be configured to process each of subbands separately. The subband processing unit 128 may be configured to perform a gain-shape vector quantization process with extended-range coarse-fine quantization in accordance with techniques of this disclosure.

A gain-shape analysis unit 104 may receive the subbands 114 as an input. For each of subbands 114, the gain-shape analysis unit 104 may determine an energy level 116 of each of the subbands 114. That is, each of subbands 114 has an associated energy level 116. The energy level 116 is a scalar value in units of decibels (dBs) that represents the total amount of energy (also called gain) in the transform coefficients of a particular one of subbands 114. The gain-shape analysis unit 104 may separate energy level 116 for one of subbands 114 from the transform coefficients of the subbands to produce residual vector 118. The residual vector 118 represents the so-called "shape" of the subband. The shape of the subband may also be referred to as the spectrum of the subband.

A vector quantizer 108 may be configured to quantize the residual vector 118. In one example, the vector quantizer 108 may quantize the residual vector using a pyramid vector quantization (PVQ) process to produce the residual ID 124. Instead of quantizing each sample separately (e.g., scalar quantization), the vector quantizer 108 may be configured to quantize a block of samples included in the residual vector 118 (e.g., a shape vector). In some examples, the vector quantizer 108 may use a Linde-Buzo-Gray (LBG) algorithm to perform the vector quantization. A Linde-Buzo-Gray (LBG) algorithm typically results in less distortion with a fixed available bit-rate compared to scalar quantization. However, any vector quantization techniques method can be used along with the extended-range coarse-fine energy quantization techniques of this disclosure.

A structured vector quantization may involve performing the quantization based upon a set of structured code-vectors that do not need to be stored explicitly and can be identified functionally. Examples of the structured vector quantizers include Lattice vector quantizers and Pyramid Vector Quantizers (PVQ). One example of how PVQ may be used is described in A. C. Hung, E. K. Tsern and T. H. Meng, "Error-resilient pyramid vector quantization for image compression," in *IEEE Transactions on Image Processing*, vol. 7, no. 10, pp. 1373-1386, October 1998. Using PVQ, the vector quantizer 108 may be configured to map the residual vector 118 to a hyperpyramid (with constant L1 norm) or a hypersphere (with constant L2 norm) and quantize the residual vector 118 upon the underlying structured codebook. The quantization code-vectors are then enumerated and assigned an ID (e.g., the residual ID 124) to be encoded and transmitted. The quality of the mapping drives the accuracy of the quantization, while the number of enumeration code-vectors specifies the shape transmission rate.

In some examples, the audio encoder 24 may dynamically allocate bits for coding the energy level 116 and the residual vector 118. That is, for each of subbands 114, the audio encoder 24 may determine the number of bits allocated for energy quantization (e.g., by the energy quantizer 106) and the number of bits allocated for vector quantization (e.g., by the vector quantizer 108). As will be explained in more detail below, the total number of bits allocated for energy quantization may be referred to as energy-assigned bits. These energy-assigned bits may then be allocated between a coarse quantization process and a fine quantization process.

An energy quantizer 106 may receive the energy level 116 of the subbands 114 and quantize the energy level 116 of the subbands 114 into a coarse energy 120 and a fine energy 122. This disclosure will describe the quantization process for one subband, but it should be understood that the energy quantizer 106 may perform energy quantization on one or more of the subbands 114, including each of the subbands 114.

In general, the energy quantizer 106 may perform a two-step quantization process. Energy quantizer 106 may first quantize the energy level 116 with a first number of bits for a coarse quantization process to generate the coarse energy 120. The energy quantizer 106 may generate the coarse energy using a predetermined range of energy levels for the quantization (e.g., the range defined by a maximum and a minimum energy level. The coarse energy 120 approximates the value of the energy level 116.

The energy quantizer 106 may then determine a difference between the coarse energy 120 and the energy level 116. This difference is sometimes called a quantization error. The energy quantizer 106 may then quantize the quantization error using a second number of bits in a fine quantization process to produce the fine energy 122. The number of bits used for the fine quantization bits is determined by the total number of energy-assigned bits minus the number of bits used for the coarse quantization process. When added together, the coarse energy 120 and the fine energy 122 represent a total quantized value of the energy level 116.

The audio encoder 24 may be further configured to encode the coarse energy 120, the fine energy 122, and the residual ID 124 using a bitstream encoder 110 to create the encoded audio data 25. The bitstream encoder 110 may be configured to further compress the coarse energy 120, the fine energy 122, and the residual ID 124 using one or more entropy encoding techniques. Entropy encoding techniques may include Huffman coding, arithmetic coding, context-adaptive binary arithmetic coding (CABAC), and other similar encoding techniques. The encoded audio data 25 may then be transmitted to the sink device 14 and/or stored in a memory for later use.

In one example of the disclosure, the quantization performed by the energy quantizer 106 is a uniform quantization. That is, the step sizes (also called "resolution") of each quantization are equal. In some examples, the steps sizes may be in units of decibels (dBs). The step size for the coarse quantization and the fine quantization may be determined, respectively, from a predetermined range of energy values for the quantization and the number of bits allocated for the quantization. In one example, the energy quantizer 106 performs uniform quantization for both coarse quantization (e.g., to produce the coarse energy 120) and fine quantization (e.g., to produce the fine energy 122).

Performing a two-step, uniform quantization process is equivalent to performing a single uniform quantization process. However, by splitting the uniform quantization into two parts, the bits allocated to coarse quantization and fine quantization may be independently controlled. This may allow for more flexibility in the allocation of bits across energy and vector quantization and may improve compression efficiency. Consider an M-level uniform quantizer, where M defines the number of levels (e.g., in dB) into which the energy level may be divided. M may be determined by the number of bits allocated for the quantization. For example, the energy quantizer 106 may use M1 levels for coarse quantization and M2 levels for fine quantization. This equivalent to a single uniform quantizer using M1*M2 levels.

Figure 3:
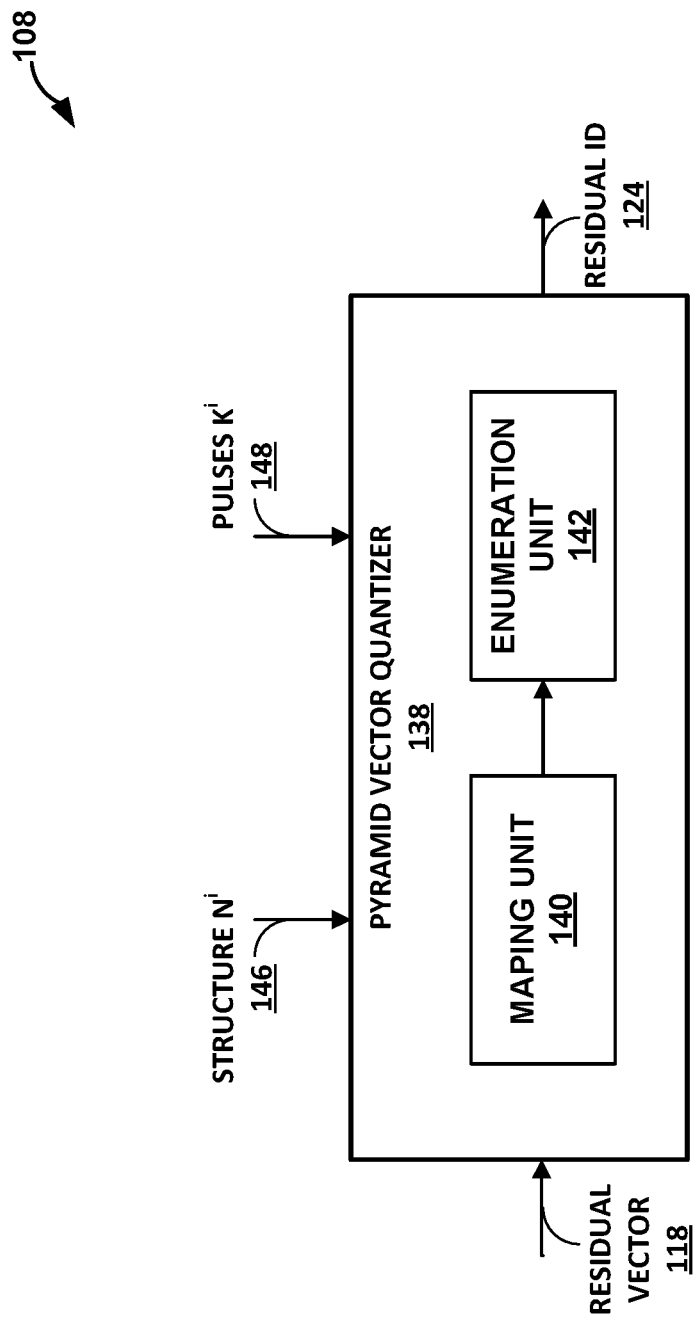
FIG. 3 is a block diagram illustrating an example vector quantizer configured to perform various aspects of the techniques described in this disclosure.

FIG. 3 is a block diagram illustrating an example vector quantizer 108 configured to perform various aspects of the techniques described in this disclosure. In particular, the vector quantizer 108 may include a pyramid vector quantizer 138 that is configured to perform pyramid vector quantization (PVQ) of residual vectors of audio data.

The residual vector 118 is input to the pyramid vector quantizer 138. As discussed above, the residual vector 118 is a residual vector of one of subbands 114 of frequency domain audio data. In operation, the pyramid vector quantizer 138 generates a residual ID 124 to encode the residual vector 118. As the residual vector 118 is a residual vector of one of subbands 114, the pyramid vector quantizer 138 may generate a separate residual ID 124 for each of the subbands 114 or vector quantizer 108 may include a separate pyramid vector quantizer 138 for each of the subbands 114. The assignment of residual IDs to the codevectors on the hypersurface may be a lossless process.

Figure 4:
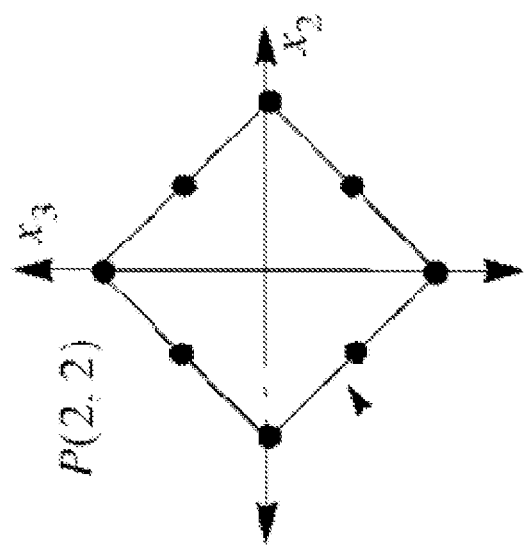
FIG. 4 is a conceptual diagram that illustrates an example hyperpyramid used for performing pyramid vector quantization.
Figure 4:
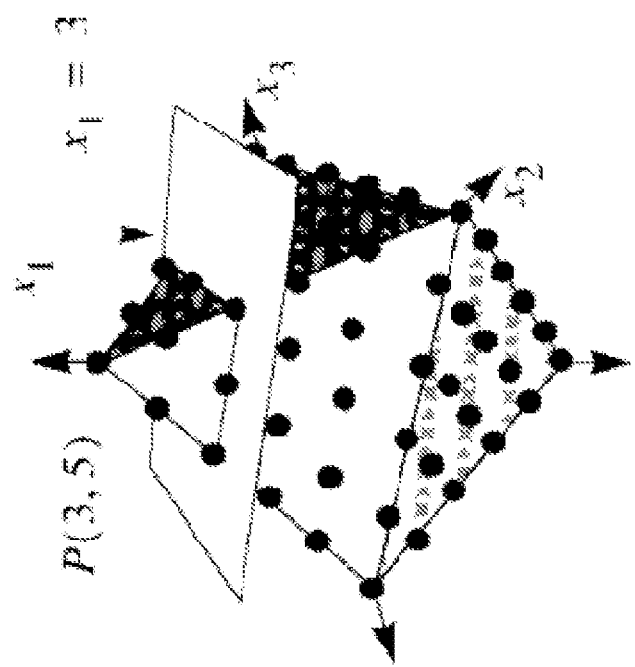

As shown in FIG. 3, the pyramid vector quantizer 138 includes a mapping unit 140 and an enumeration unit 142. To perform PVQ, the mapping unit 140 may map the residual vector 118 onto an N-dimensional hypersurface (e.g., a hyperpyramid) and the enumeration unit 142 may assign a unique identifier (ID) to each codevector on the hypersurface. The mapping of a residual vector may be parameterized by a structure N 146 and pulses K 148. The structure N 146 may represent the number of samples in the residual vector to be quantized (i.e., the number of samples in residual vector 118) and the pulses K 148 may represent the number of pulses to be included on the N-dimensional hypersurface. FIG. 4 is a conceptual diagram that illustrates an example hyperpyramid used for performing pyramid vector quantization. In the example of FIG. 4, the hyperpyramid had an N of 3 and a K of 5.

The level of quantization of the residual vector 118, and thus the loss, is dependent on the number of pulses K 148 used for the subband. The number of pulses K 148 used for a subband is dependent on the number of bits allocated to encoding the residual vector in the subband. Subbands that are allocated higher numbers of bits may be encoded using more pulses, which may result in less distortion (i.e., loss) than subbands that are allocated lower numbers of bits.

Figure 5:
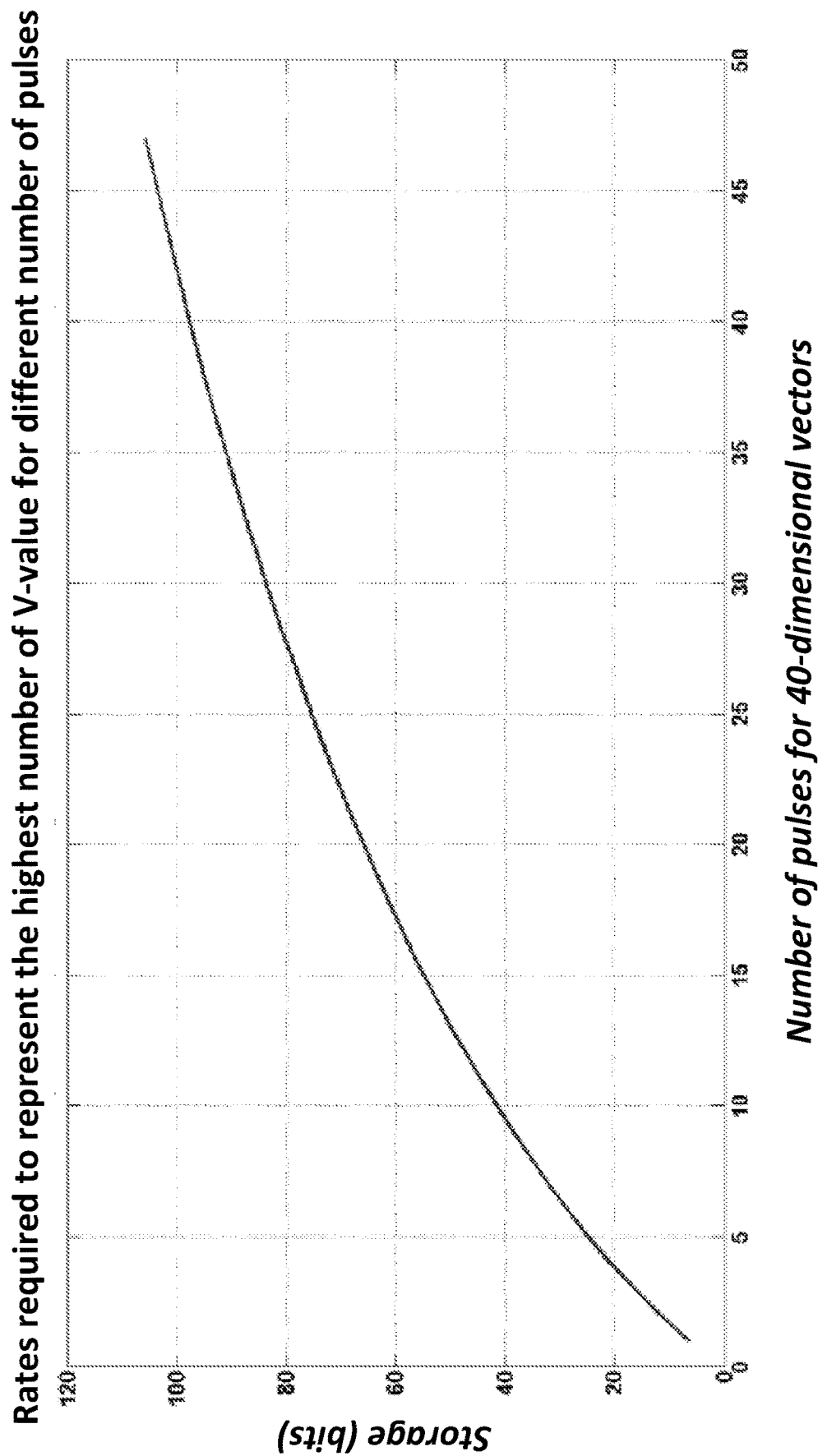
FIG. 5 is a graph illustrating the amount of storage required to explicitly store V-vectors as a function of pulses.

FIG. 5 is a graph illustrating the amount of storage required to explicitly store V-vectors as a function of pulses. Specifically, FIG. 5 shows the storage requirements of V-vectors for performing PVQ with different pulse counts and an N of 40 (i.e., 40 dimensional residual vectors). As discussed above, the V-vectors used to perform PVQ may require a large amount of table memory. For example, explicit storage of V-values for 28 subbands may require ~11,302 kB. Larger values of N (i.e., higher dimensions) cause the storage requirements to grow very quickly.

Storing the entire table entries may be not be feasible either. For example, memory requirements cannot be fulfilled for large scale implementations. However, in accordance with one or more techniques of this disclosure, existing redundancy when the tables are used for several subbands can be exploited to reduce the storage requirements significantly. Additionally, permutations without replacements can be used to reduce memory with up to one bit for each entry. Symmetry of the resulting table may provide further room for memory savings which leads to U representation. Further compressions utilizing relationships among different vectors of different representations can further reduce the size of stored data.

Figure 6:
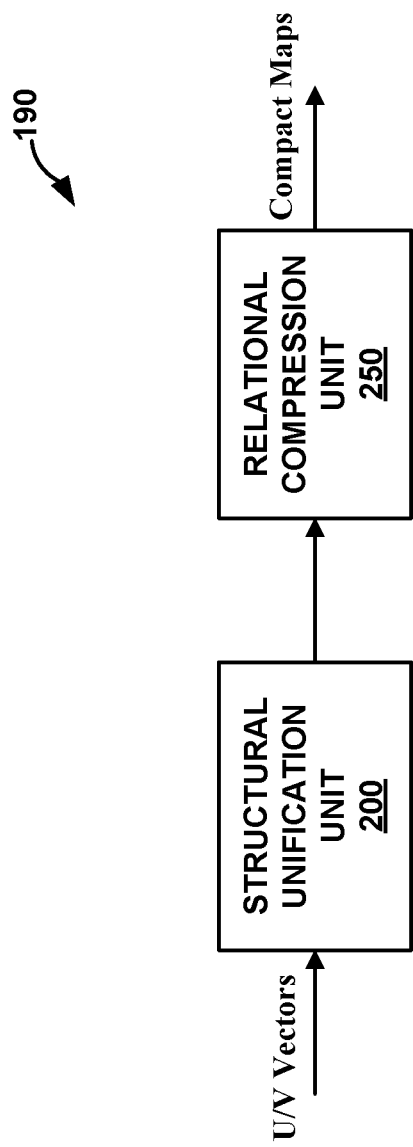
FIG. 6 is a block diagram illustrating an example compact map generation unit, in accordance with one or more techniques of this disclosure.

FIG. 6 is a block diagram illustrating an example compact map generation unit 190, in accordance with one or more techniques of this disclosure. The compact map generation unit 190 may be included in one or both of source device 12 and sink device 14. In some examples, the compact map generation unit 190 may be included in a device other than source device 12 and sink device 14 and may provide the generated compact maps to one or both of source device 12 and sink device 14.

As shown in FIG. 6, the compact map generation unit 190 includes a structural unification unit 200 and a relational compression unit 250. Together, the structural unification unit 200 and the relational compression unit 250 perform structural unification and relational compression to generate an enumeration map and unique ID that corresponds to a bit value of one or more audio samples. Structural unification and relational compression is equivalent to direct or inverse PVQ enumeration (e.g., as performed by the enumeration unit 142).

U or V-Vectors are input to the structural unification unit 200, which performs structural unification to generate a plurality of unified vectors. As different numbers of coefficients will point to different V-values with different dimensions, hashing can be used to represent data (e.g., by defining $n_m$'s as keys and $V_{n,k}$'s of all possible pulses as values). A unique representation of n $$n_u = [n_i]_{I \times 1}$$

Where I≤M, keys are $\{n_i\}_{i=1}^{I}$, pointing to values $\{v_i\}_{i=1}^{I}$ defined as $$v_i = [V_{n_i,k}]_{K_i \times 1} \text{ where } K_i = \max_i \{k_i\}$$

$$V(n_i, K_i) \leq 2^{B_{i,max}}$$

Figure 7:
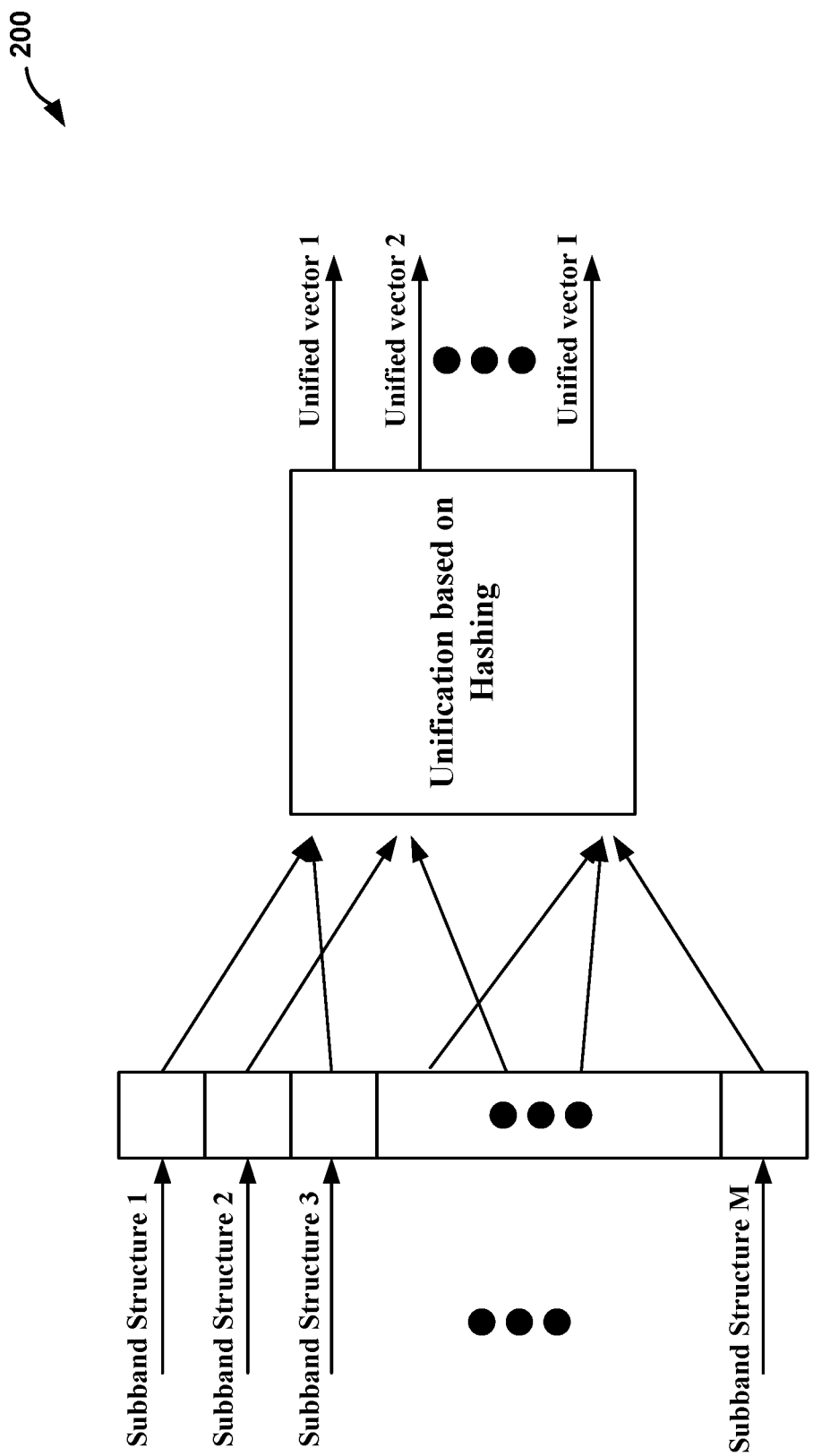
FIG. 7 is a conceptual diagram illustrating performance of structural unification to generate unified vectors, in accordance with one or more techniques of this disclosure.

As such, the structural unification unit 200 may map multiple subbands to one unified vector (that is the value of the hash). By generating the unified vectors from all of the different subbands, the audio encoder may remove redundancy between the subbands. For instance, as shown in FIG. 7, the structural unification unit 200 may perform hashing to generate I unified vectors from M subbands. As one example, the structural unification unit 200 may perform hashing to generate 6 or 7 unified vectors from 28 subbands.

V is the original V function that does the enumeration. V determines total number of quantization points, once you have N and K, and it may become a recursive function such that every single time that you have the U vector you have to go through the recursion.

U function is another representation of V, the difference is that it requires less bits for each cell, as a result of the matrix being symmetric. To generate the U-Vectors, the compact map generation unit 190 may perform a permutation by replacement, so total number of possible selections once the number of pulses is known is one less, requires a lot less memory, is one order of bits less memory required, not readily transferable to getting a unique id, but the U representation step which is quantization.

To generate the U-representation, for any V-table the compact map generation unit 190 may find a symmetric U-table such that $$U(N,K) + U(N,K+1) = V(N,K) \; N \geq 0 \text{ and } K \geq 0$$

As stated above, the U-representation information content is at most approximately one bit less than that of V-values in a V-representation, in average $$U(N,K) \leq V(N,K) \leq 2U(N,K+1)$$

$$\log_2(U(N,K)) \leq \log_2(V(N,K)) \leq 1 + \log_2(U(N,K+1))$$

Another storage saving is provided by U-representation due to its symmetry $$U(N,K) = U(K,N)$$

However, use of the U-representation comes with extra computations, due to one more recall and addition per ID. U-representation can save storage as a form of representation of data, but cannot provide unique IDs directly. Equivalent V-values need to be eventually used for transmission to the decoder.

The structural unification may be effective because some similarities may exist between subbands. As such, the structural unification unit 200 may look at all sub-bands and look at all similarities so it can unify the subbands so that they would be similar in terms of U and V vectors, multiple sub-bands can be mapped to one unified vector (that may be the value of the hash).

The following table provide example memory requirements in kB for a V-representation, U-representation, and the developed subbanding-based unified implementation of the adaptive PVQ. As can be see, the developed unified approach (in accordance with this disclosure) based on the subbanding in this mode offers significant reduction in memory. It is over 97% and 90% more memory efficient than V- and U-representations, respectively.

| Realization | V-representation | U-representation | Developed unified |
|---|---|---|---|
| Memory (kB) | 11.3 | 2.97 | 0.29 |

The output of the structural unification unit 200 (i.e., the unified vectors) may be provided as input to the relational compression unit 250. The relational compression unit 250 may perform inter-vector or intra-vector compression on the unified vectors. This may result in additional storage savings over just using the unified vectors.

To perform inter-vector compression, the audio encoder may assume a base vector and formulate the remaining vectors as functions of the base vector. As such, the audio encoder may only have to store the following (which may be less than the storage required for the uncompressed vectors):

$$\{\{[m_{ib,nz}^T, r_{ib,nz}] = \{1, \ldots, M\} - \{b\}\}, v_b\}$$

Figure 8:
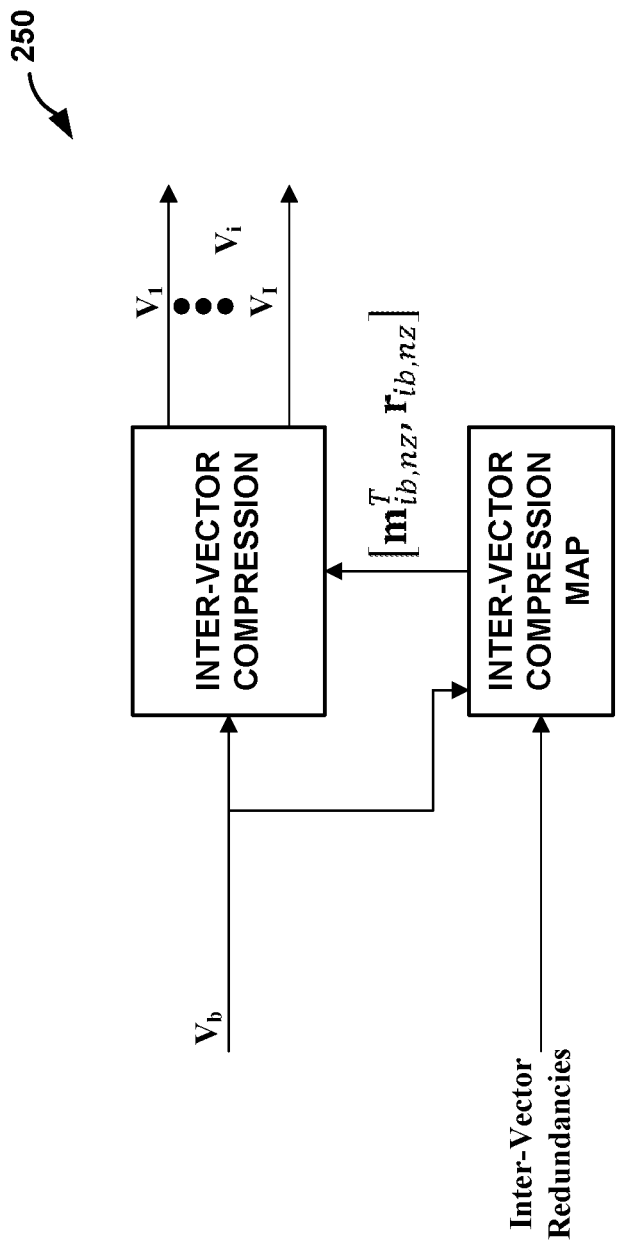
FIG. 8 is a block diagram illustrating an example relational compression unit that may perform inter-vector compression, in accordance with one or more techniques of this disclosure.

FIG. 8 is a block diagram illustrating an example relational compression unit 250 that may perform inter-vector compression, in accordance with one or more techniques of this disclosure. As shown in FIG. 8, the relational compression unit 250 may obtain a base vector $V_b$ and output inter compressed vectors $V_i$. Considering inter-vector redundancies, data can be compressed by assuming the base vector and formulating the remaining vectors as functions of the base. Each non-base vector may be represented as:

$$v_i = m_{ib}^T v_b + r_{ib} \text{ for all } i \neq b$$

Then the storage set $$\{\{[m_{ib,nz}^T, r_{ib,nz}], i = \{1, \ldots, M\} - \{b\}\}, v_b\}$$

In some examples, the relational compression unit 250 may only store non-zero values. Therefore:

$$|m_{ib,nz}| \leq |m_{ib}| \text{ and } |r_{ib,nz}| \leq |r_{ib}|$$

To perform intra-vector compression, the relational compression unit 250 may store difference values. For instance, as opposed to storing $\{V_1, V_2, \text{ and } V_3\}$, the relational compression unit 250 $\{V_1, \Delta V_1, \text{ and } \Delta V_2\}$ where $V_2 = \Delta V_1 + V_1$ and $V_3 = \Delta V_2 + V_2$, which is be less than the storage required for the uncompressed vectors.

Figure 10:
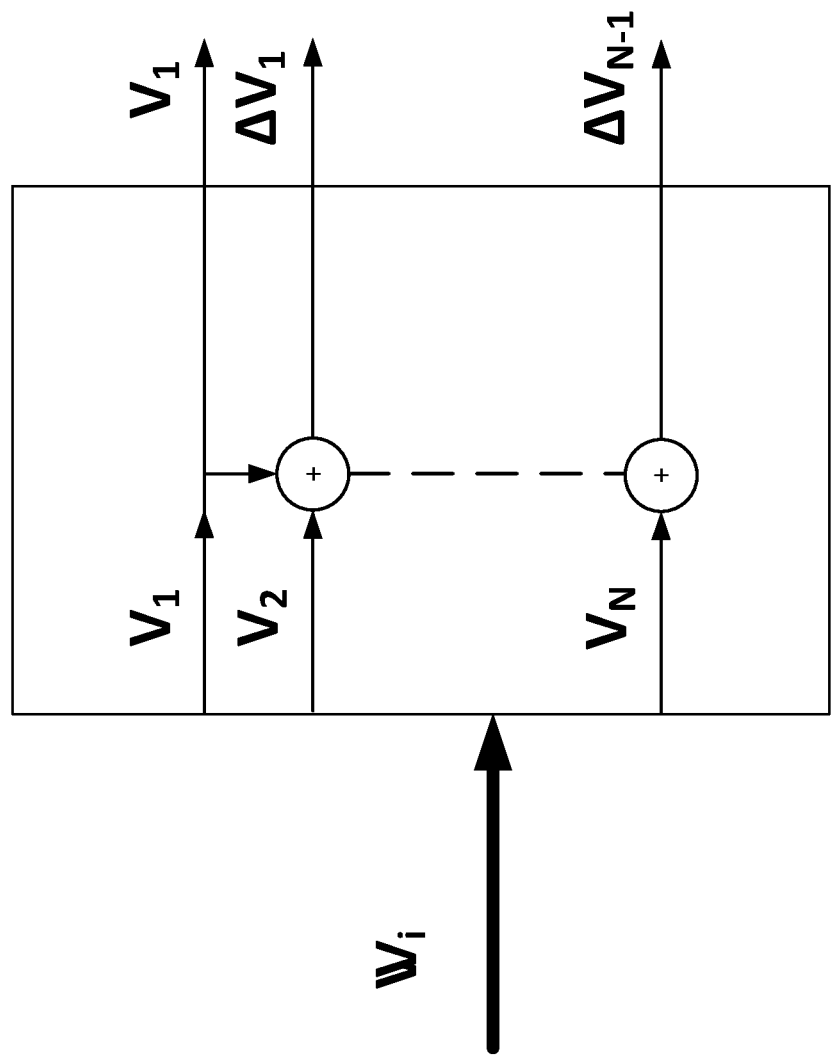
FIG. 10 is a block diagram illustrating an example relational compression unit that may perform intra-vector compression, in accordance with one or more techniques of this disclosure.

FIG. 10 is a block diagram illustrating an example relational compression unit 250 that may perform intra-vector compression, in accordance with one or more techniques of this disclosure. As shown in FIG. 10, the relational compression unit 250 may obtain inter compressed vectors $V_i$ and output intra compressed vectors. As discussed above, instead of storing explicit values, difference vectors can be considered.

$$\{V_1, V_2, \ldots V_n, \ldots V_N\} \; \{V_1, \Delta V_1, \ldots \Delta V_{n-1}, \ldots \Delta V_{N-1}\}$$

In which $V_n = V_{n-1} + \Delta V_{n-1}$

As such, if the expect value of the storage required is:

$$S_V = \frac{1}{N} \sum_{n=1}^{N} S_{V_n}$$

And $$S_{\Delta V} = \frac{1}{N-1} \sum_{n=1}^{N-1} S_{\Delta V_n}$$

The total memory savings $$\Delta S = (N \cdot S_V) - (S_{V_1} + (N-1) \cdot S_{\Delta V}) =$$

$$\left( S_{V_1} + \frac{N}{N-1} \sum_{n=2}^{N} S_{V_n} \right) - (S_{V_1} + (N-1) \cdot S_{\Delta V}) =$$

$$\frac{N}{N-1} \sum_{n=2}^{N} S_{V_n} - (N-1) S_{\Delta V}$$

Then, as N grows $$\lim_{N \to \infty} \Delta S = (N-1) \cdot S_V - (N-1) \cdot S_{\Delta V} = (N-1)(S_V - S_{\Delta V})$$

$$\overline{\Delta S} = \lim_{N \to \infty} \frac{1}{N} \Delta S = S_V - S_{\Delta V}$$

As such, storage savings may be ensured.

Figure 9:
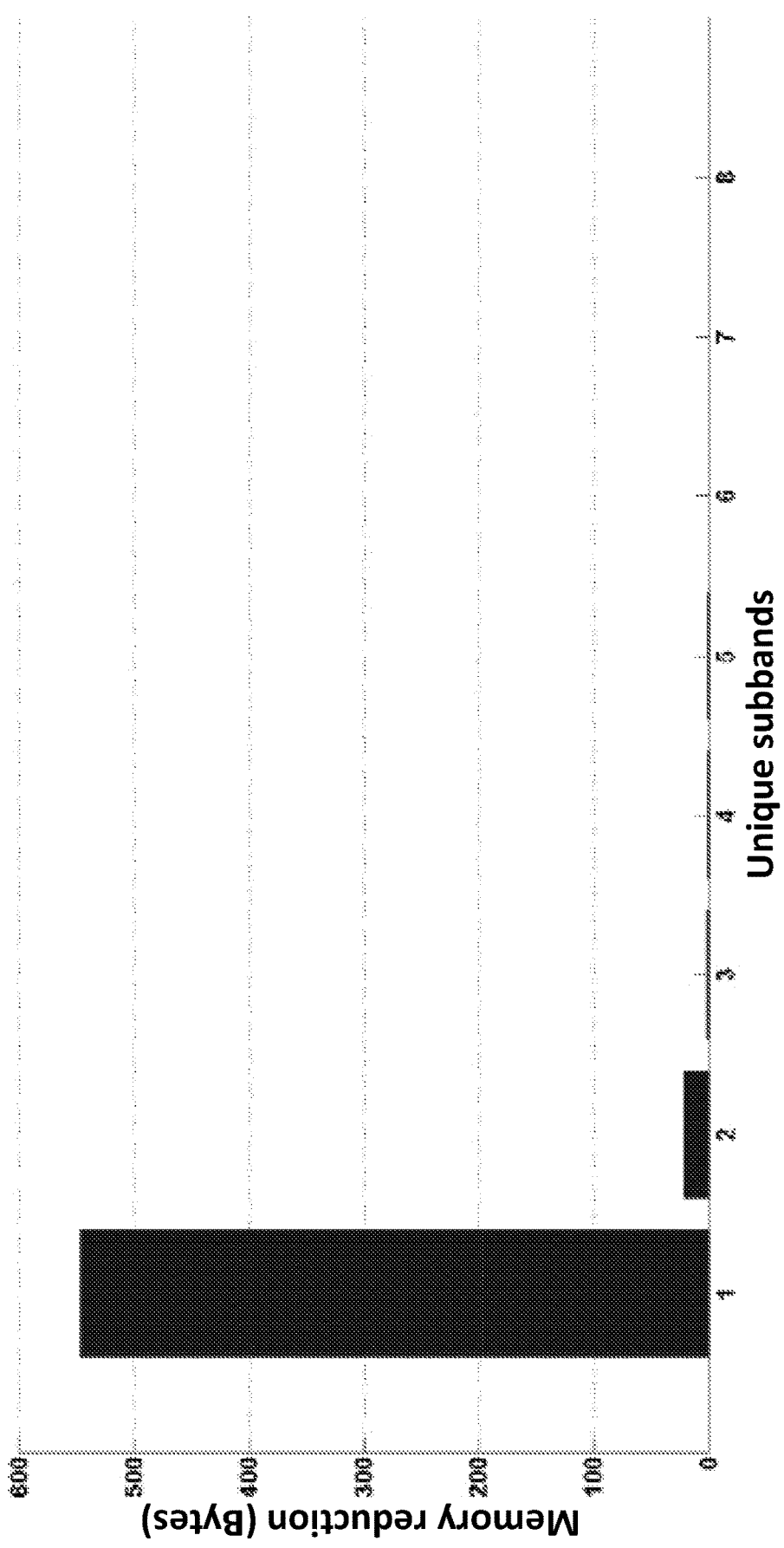
FIG. 9 is a graph illustrating example memory reductions on unique subbands using inter-vector compression, in accordance with one or more techniques of this disclosure.
Figure 11:
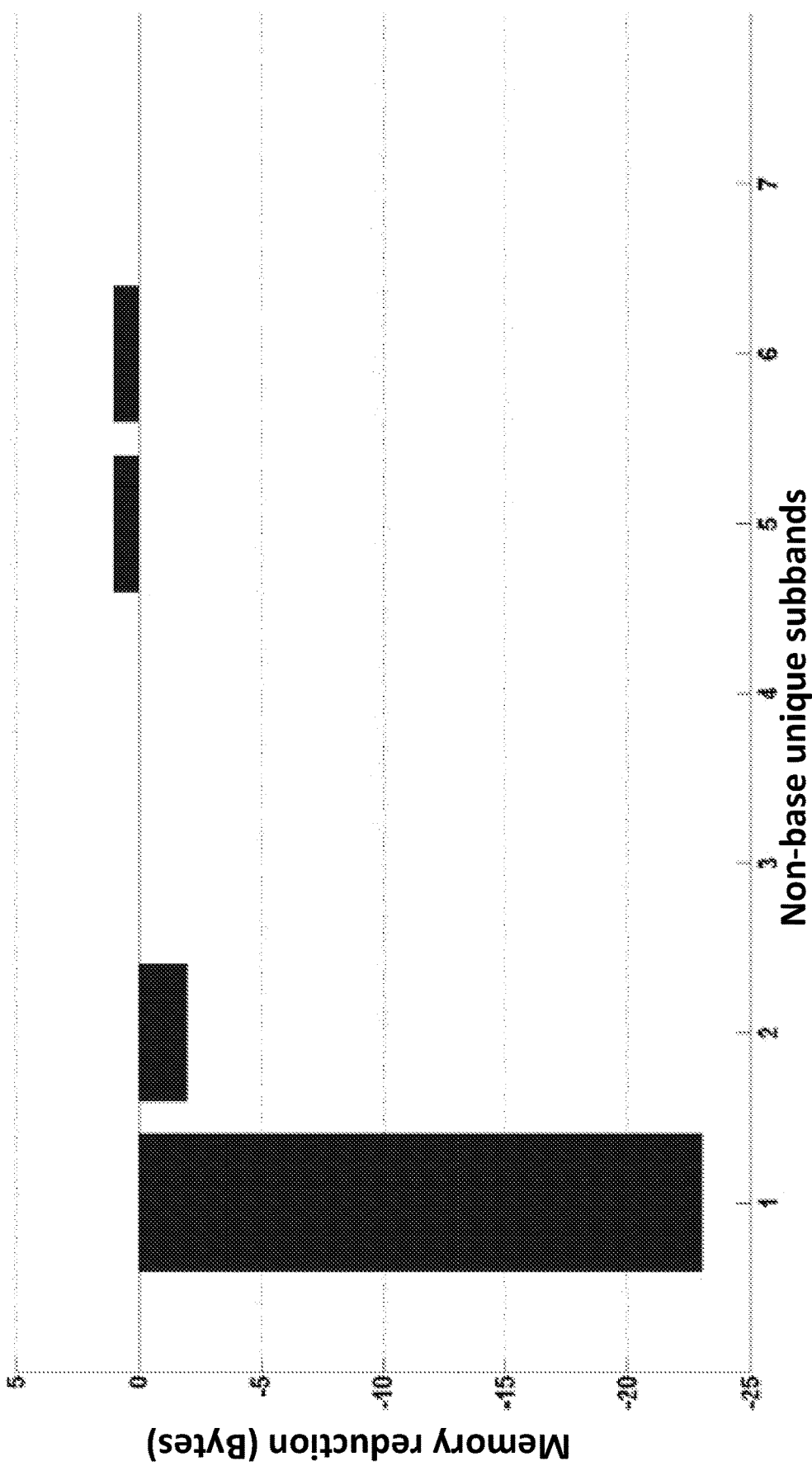
FIG. 11 is a graph illustrating example memory reductions on unique subbands using intra-vector compression, in accordance with one or more techniques of this disclosure.

FIG. 9 is a graph illustrating example memory reductions on unique subbands using inter-vector compression, in accordance with one or more techniques of this disclosure. FIG. 11 is a graph illustrating example memory reductions on unique subbands using intra-vector compression, in accordance with one or more techniques of this disclosure. As can be seen from FIG. 9 and FIG. 11, inter-vector redundancies are more advantageous in lower subbands in contrast to intra-vector redundancies in higher subbands. As a result, differentiations in lower subbands, versus linear mappings in higher subbands may be advantageous.

The subbanding-based unification, and relational compression rules for inter-vector and intra-vector redundancies lead to lossless compression, reduced computations and storage saving may always be guaranteed.

As an example problem-specific realization, up to 90% reduction in storage and no performance loss were achieved within a dynamic bit allocation in audio transform domain for an example MDCT-based implementation. In a lower compression encoder, residual quantization processing performance was reduced by ~64% (from 17.00 MIPS (Millions of instructions per second) down to 6.16 MIPS on Qualcomm® Kalimba™ DSP (Digital Signal Processor))

Figure 12:
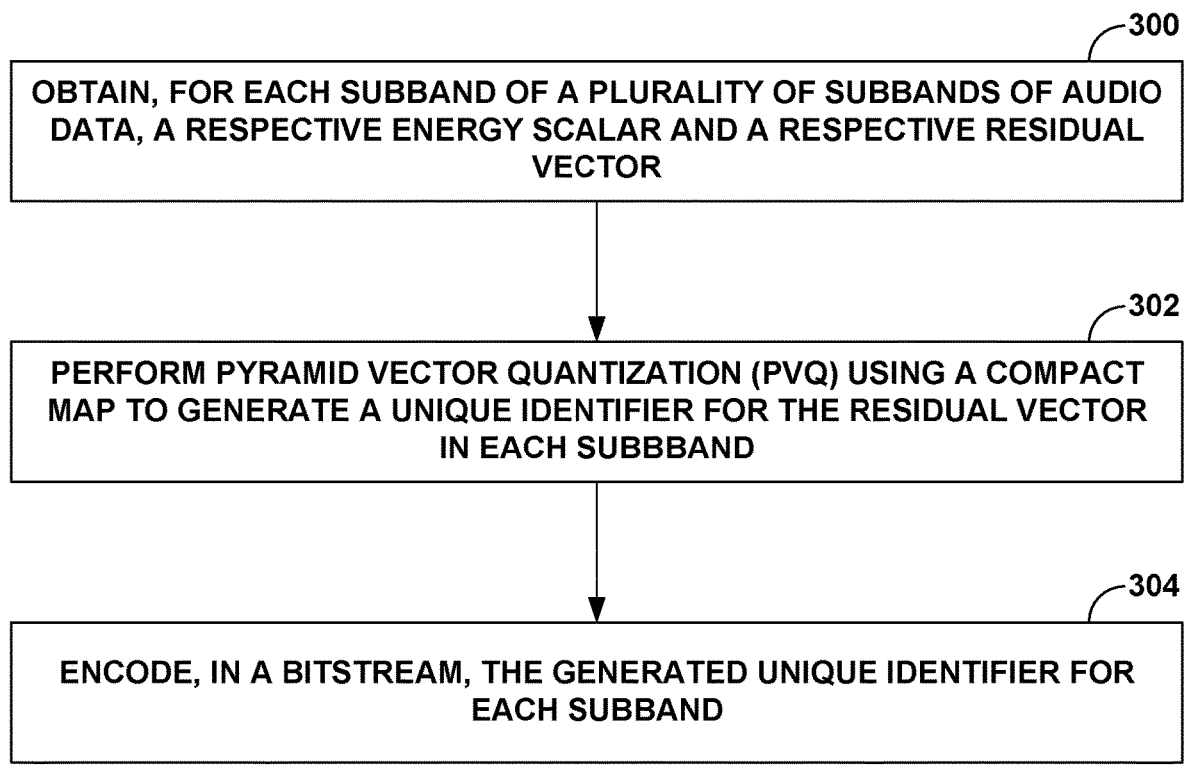
FIG. 12 is a flowchart illustrating example operation of the source device of FIG. 1 in performing various aspects of the techniques described in this disclosure.

FIG. 12 is a flowchart illustrating example operation of the source device 12 of FIG. 1 in performing various aspects of the techniques described in this disclosure. As shown in the example of FIG. 12, the audio encoder 24 of the source device 12 may be configured to encode audio data using compact maps in accordance with the techniques of this disclosure.

The audio encoder 24 may be configured to obtain, for each subband of a plurality of subbands of audio data, a respective energy scalar and a respective residual vector (300). For instance, gain-shape analysis unit 104 of audio encoder 24 may generate, for each of subbands 114, a respective energy level 116 and a respective residual vector 118.

The audio encoder 24 may be further configured to perform pyramid vector quantization (PVQ) using a compact map to generate a unique identifier for the residual vector in each subband (302). For instance, the vector quantizer 108 may use a compact map generated using structural unification of vectors across subbands and relational compression to generate a residual ID 124 for each subband. By using the compact map, the vector quantizer 108 may avoid having to explicitly store all of the possible codevectors that may be used by various combinations of N and K.

The audio encoder 24 may encode, in an encoded audio bitstream, the generated unique identifier for each subband (304). For instance, the audio encoder 24 may encode each of residual IDs 124 in the encoded audio bitstream 31 which is transmitted to the sink device 14 over transmission channel 31.

Figure 13:
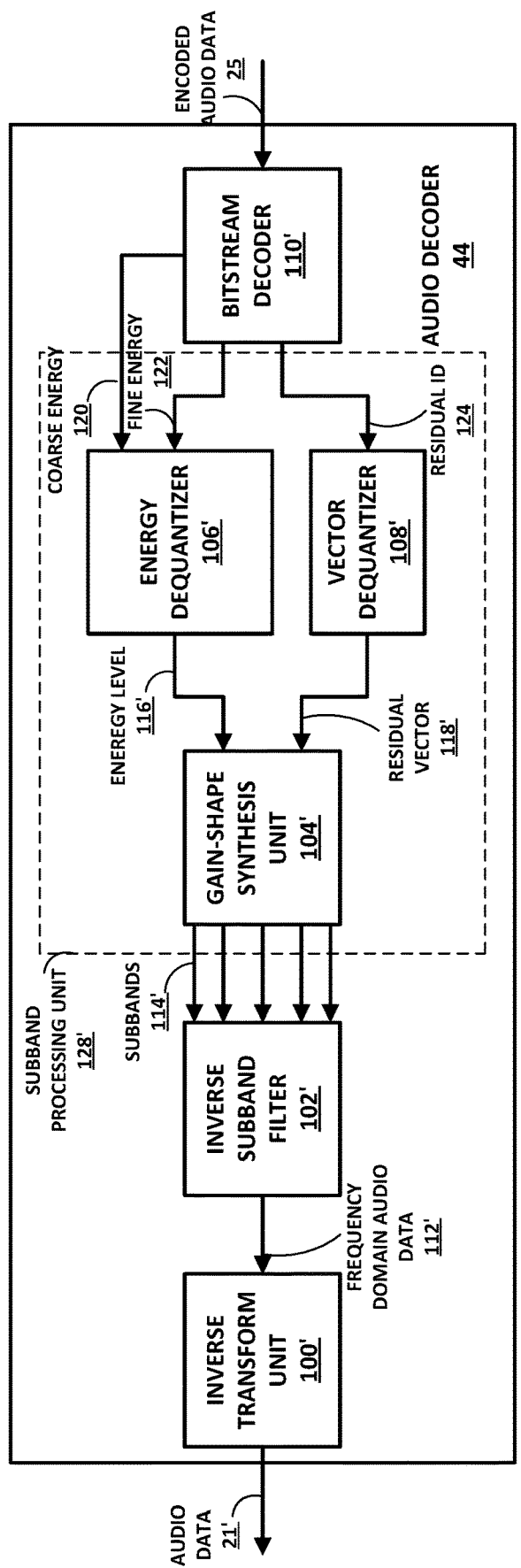
FIG. 13 is a block diagram illustrating an example audio decoder configured to perform various aspects of the techniques described in this disclosure

FIG. 13 is a block diagram illustrating an implementation of the audio decoder 44 of FIG. 1 in more detail. The audio decoder 44 may be configured to decode audio data received over a PAN (e.g., Bluetooth®). However, the techniques of this disclosure performed by the audio decoder 44 may be used in any context where the compression of audio data is desired. In some examples, the audio decoder 44 may be configured to decode the audio data 21' in accordance with as aptX™ audio codec, including, e.g., enhanced aptX—E-aptX, aptX live, and aptX high definition. However, the techniques of this disclosure may be used in any audio codec configured to perform cooperative pyramid vector quantization (PVQ) of audio data. As will be explained in more detail below, the audio decoder 44 may be configured to perform various aspects of a PVQ process using compact maps in accordance with techniques of this disclosure.

In general, audio decoder 44 may operate in a reciprocal manner with respect to audio encoder 24. As such, the same process used in the encoder for quality/bitrate scalable cooperative PVQ can be used in the audio decoder 44. The decoding is based on the same principals, with inverse of the operations conducted in the decoder, so that audio data can be reconstructed from the encoded bitstream received from encoder. Each quantizer has an associated unquantizater counterpart. For example, as shown in FIG. 13, inverse transform unit 100', inverse subband filter 102', gain-shape synthesis unit 104', energy dequantizer 106', vector dequantizer 108', and bitstream decoder 110' may be respectively configured to perform inverse operations with respect to transform unit 100, subband filter 102, gain-shape analysis unit 104, energy quantizer 106, vector quantizer 108, and bitstream encoder 110 of FIG. 2.

In particular, the gain-shape synthesis unit 104' reconstructs the frequency domain audio data, having the reconstructed residual vectors along with the reconstructed energy levels. The inverse subband filter 102' and the inverse transform unit 100' output the reconstructed audio data 21'. In examples where the encoding is lossless, the reconstructed audio data 21' may perfectly match the audio data 21. In examples where the encoding is lossy, the reconstructed audio data 21' may not perfectly match the audio data 21.

In this way, audio decoder 44 represents a device configured to receive an encoded audio bitstream (e.g., encoded audio data 25); decode, from the encoded audio bitstream, a unique identifier for each of a plurality of subbands of audio data (e.g., bitstream decoder 110' outputs residual ID 124); perform inverse pyramid vector quantization (PVQ) using a compact map to reconstruct a residual vector for each subband of the plurality of subbands of the audio data based on the unique identifier for the respective subband of the plurality of subbands of the audio data (e.g., vector dequantizer 108' performs the inverse PVQ); and reconstruct, based on the residual vectors and energy scalars for each subband, the plurality of subbands of the audio data (e.g., gain-shape synthesis unit 104' reconstructs the subbands 114').

Figure 14:
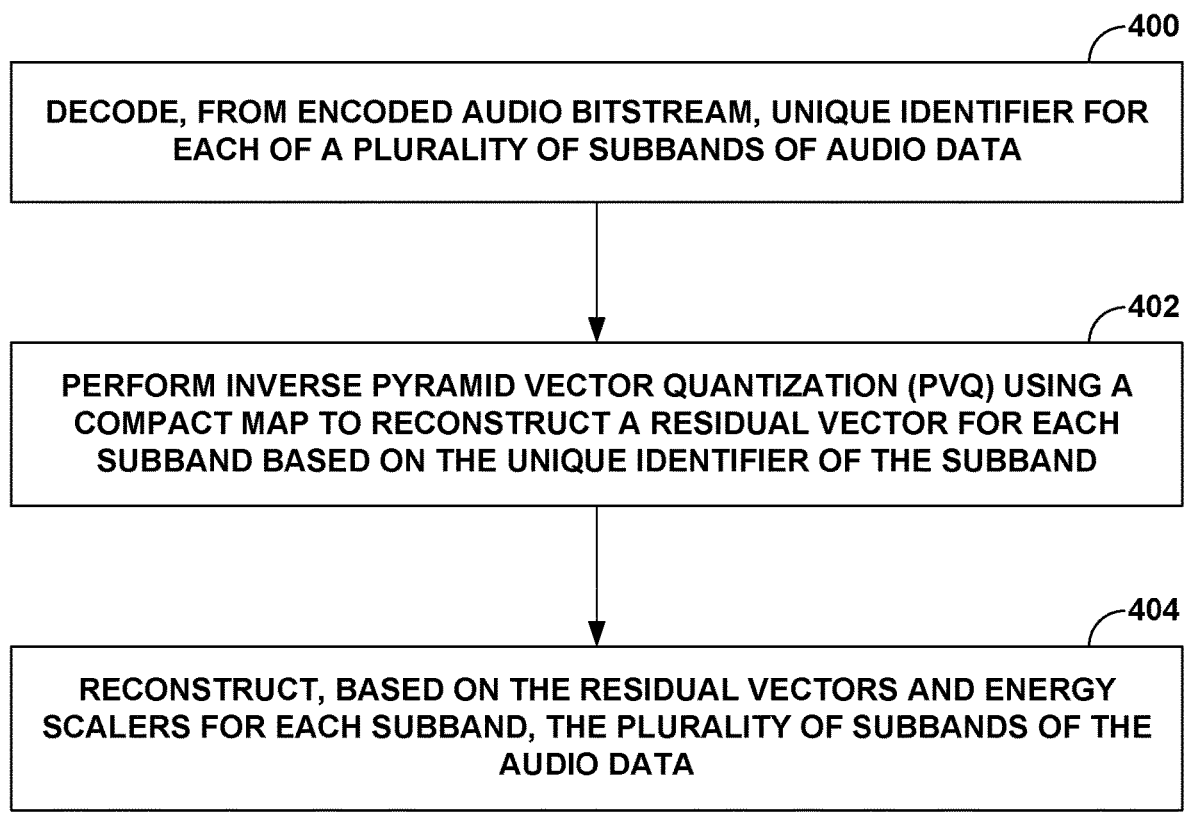
FIG. 14 is a flowchart illustrating example operation of the sink device of FIG. 1 in performing various aspects of the techniques described in this disclosure.

FIG. 14 is a flowchart illustrating example operation of the sink device 14 of FIG. 1 in performing various aspects of the techniques described in this disclosure. As shown in the example of FIG. 14, the audio decoder 44 of the sink device 14 may be configured to decode audio data using compact maps in accordance with the techniques of this disclosure.

The audio decoder 44 may be configured to decode, from an encoded audio bitstream, a unique identifier for each of a plurality of subbands of audio data (400). For instance, the audio decoder 44 may decode residual IDs 124 from the encoded audio bitstream 31.

The audio decoder 44 may perform inverse PVQ using a compact map to reconstruct a residual vector for each subband of the plurality of subbands of the audio data based on the unique identifier for the respective subband of the plurality of subbands of the audio data (402). For instance, the audio decoder 44 may use a compact map similar or identical to the one used by the audio encoder 24 to identify a codevector that corresponds to each of residual IDs 124. By using the compact map, the audio decoder 44 may avoid having to explicitly store all of the possible codevectors that may be used by various combinations of N and K.

The audio decoder 44 may reconstruct, based on the residual vectors and energy scalars for each subband, the plurality of subbands of the audio data (404). For instance, the audio decoder 44 may perform a process generally reciprocal to gain-shape analysis unit 104 to reconstruct that audio data using the identified codevectors and energy scalars decoded from the encoded audio bitstream.

Figure 15:
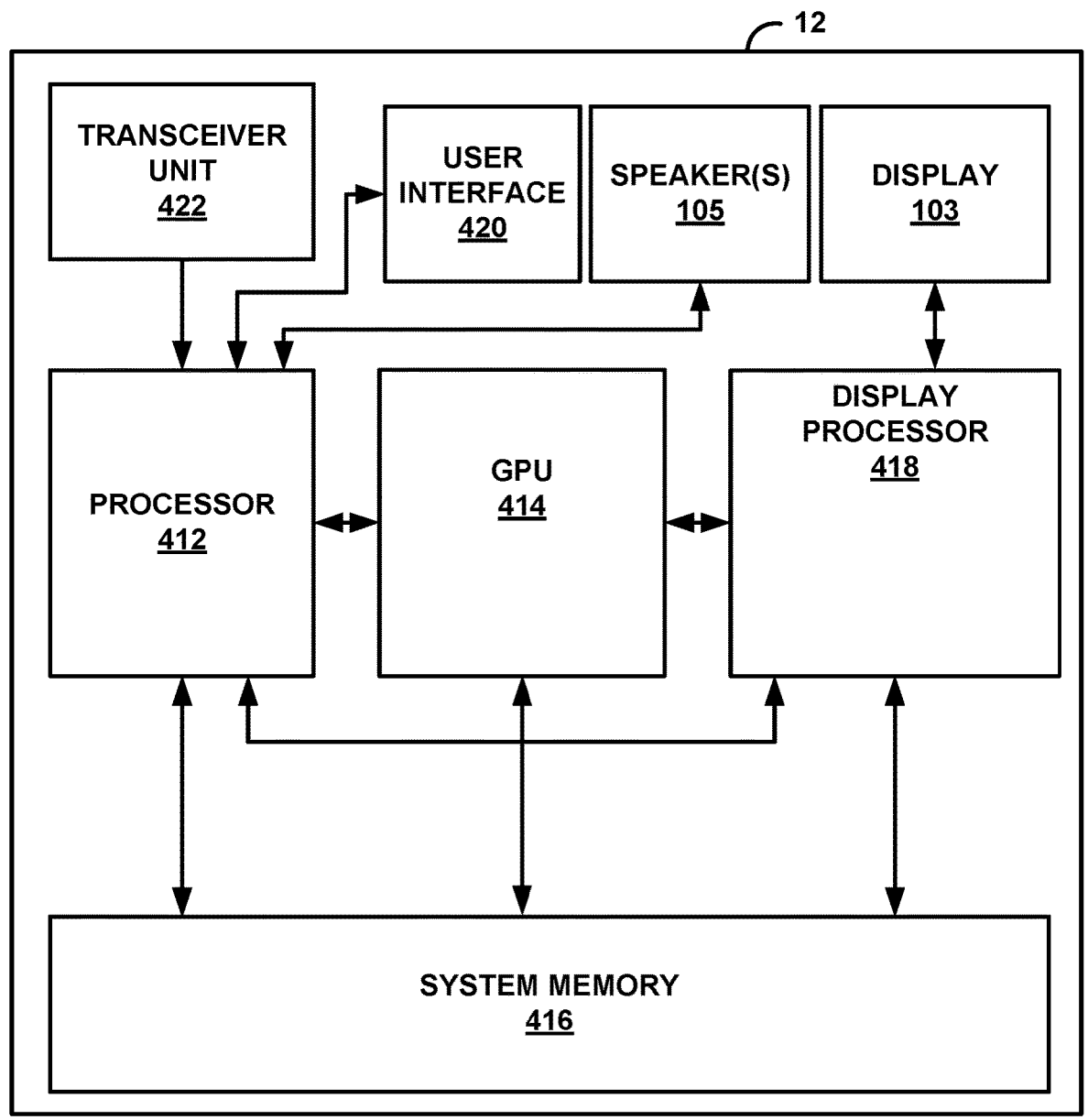
FIG. 15 is a block diagram illustrating example components of the source device shown in the example of FIG. 1.

FIG. 15 is a block diagram illustrating example components of the source device 12 shown in the example of FIG. 1. In the example of FIG. 15, the source device 12 includes a processor 412, a graphics processing unit (GPU) 414, system memory 416, a display processor 418, one or more integrated speakers 105, a display 103, a user interface 420, and a transceiver unit 422. In examples where the source device 12 is a mobile device, the display processor 418 is a mobile display processor (MDP). In some examples, such as examples where the source device 12 is a mobile device, the processor 412, the GPU 414, and the display processor 418 may be formed as an integrated circuit (IC).

For example, the IC may be considered as a processing chip within a chip package and may be a system-on-chip (SoC). In some examples, two of the processors 412, the GPU 414, and the display processor 418 may be housed together in the same IC and the other in a different integrated circuit (i.e., different chip packages) or all three may be housed in different ICs or on the same IC. However, it may be possible that the processor 412, the GPU 414, and the display processor 418 are all housed in different integrated circuits in examples where the source device 12 is a mobile device.

Examples of the processor 412, the GPU 414, and the display processor 418 include, but are not limited to, one or more digital signal processors (DSPs), general purpose microprocessors, application specific integrated circuits (ASICs), field programmable logic arrays (FPGAs), or other equivalent integrated or discrete logic circuitry. The processor 412 may be the central processing unit (CPU) of the source device 12. In some examples, the GPU 414 may be specialized hardware that includes integrated and/or discrete logic circuitry that provides the GPU 414 with massive parallel processing capabilities suitable for graphics processing. In some instances, GPU 414 may also include general purpose processing capabilities, and may be referred to as a general-purpose GPU (GPGPU) when implementing general purpose processing tasks (i.e., non-graphics related tasks). The display processor 418 may also be specialized integrated circuit hardware that is designed to retrieve image content from the system memory 416, compose the image content into an image frame, and output the image frame to the display 103.

The processor 412 may execute various types of the applications 20. Examples of the applications 20 include web browsers, e-mail applications, spreadsheets, video games, other applications that generate viewable objects for display, or any of the application types listed in more detail above. The system memory 416 may store instructions for execution of the applications 20. The execution of one of the applications 20 on the processor 412 causes the processor 412 to produce graphics data for image content that is to be displayed and the audio data 21 that is to be played (possibly via integrated speaker 105). The processor 412 may transmit graphics data of the image content to the GPU 414 for further processing based on and instructions or commands that the processor 412 transmits to the GPU 414.

The processor 412 may communicate with the GPU 414 in accordance with a particular application processing interface (API). Examples of such APIs include the DirectX® API by Microsoft®, the OpenGL® or OpenGL ES® by the Khronos group, and the OpenCL'; however, aspects of this disclosure are not limited to the DirectX, the OpenGL, or the OpenCL APIs, and may be extended to other types of APIs. Moreover, the techniques described in this disclosure are not required to function in accordance with an API, and the processor 412 and the GPU 414 may utilize any technique for communication.

The system memory 416 may be the memory for the source device 12. The system memory 416 may comprise one or more computer-readable storage media. Examples of the system memory 416 include, but are not limited to, a random-access memory (RAM), an electrically erasable programmable read-only memory (EEPROM), flash memory, or other medium that can be used to carry or store desired program code in the form of instructions and/or data structures and that can be accessed by a computer or a processor.

In some examples, the system memory 416 may include instructions that cause the processor 412, the GPU 414, and/or the display processor 418 to perform the functions ascribed in this disclosure to the processor 412, the GPU 414, and/or the display processor 418. Accordingly, the system memory 416 may be a computer-readable storage medium having instructions stored thereon that, when executed, cause one or more processors (e.g., the processor 412, the GPU 414, and/or the display processor 418) to perform various functions.

The system memory 416 may include a non-transitory storage medium. The term "non-transitory" indicates that the storage medium is not embodied in a carrier wave or a propagated signal. However, the term "non-transitory" should not be interpreted to mean that the system memory 416 is non-movable or that its contents are static. As one example, the system memory 416 may be removed from the source device 12 and moved to another device. As another example, memory, substantially similar to the system memory 416, may be inserted into the source device 12. In certain examples, a non-transitory storage medium may store data that can, over time, change (e.g., in RAM).

The user interface 420 may represent one or more hardware or virtual (meaning a combination of hardware and software) user interfaces by which a user may interface with the source device 12. The user interface 420 may include physical buttons, switches, toggles, lights or virtual versions thereof. The user interface 420 may also include physical or virtual keyboards, touch interfaces—such as a touchscreen, haptic feedback, and the like.

The processor 412 may include one or more hardware units (including so-called "processing cores") configured to perform all or some portion of the operations discussed above with respect to one or more of the mixing unit 22, the audio encoder 24, the wireless connection manager 26, and the wireless communication units 30. The transceiver unit 422 may represent a unit configured to establish and maintain the wireless connection between the source device 12 and the sink device 14. The transceiver unit 422 may represent one or more receivers and one or more transmitters capable of wireless communication in accordance with one or more wireless communication protocols. The transceiver unit 422 may perform all or some portion of the operations of one or more of the wireless connection manager 26 and the wireless communication units 30.

Figure 16:
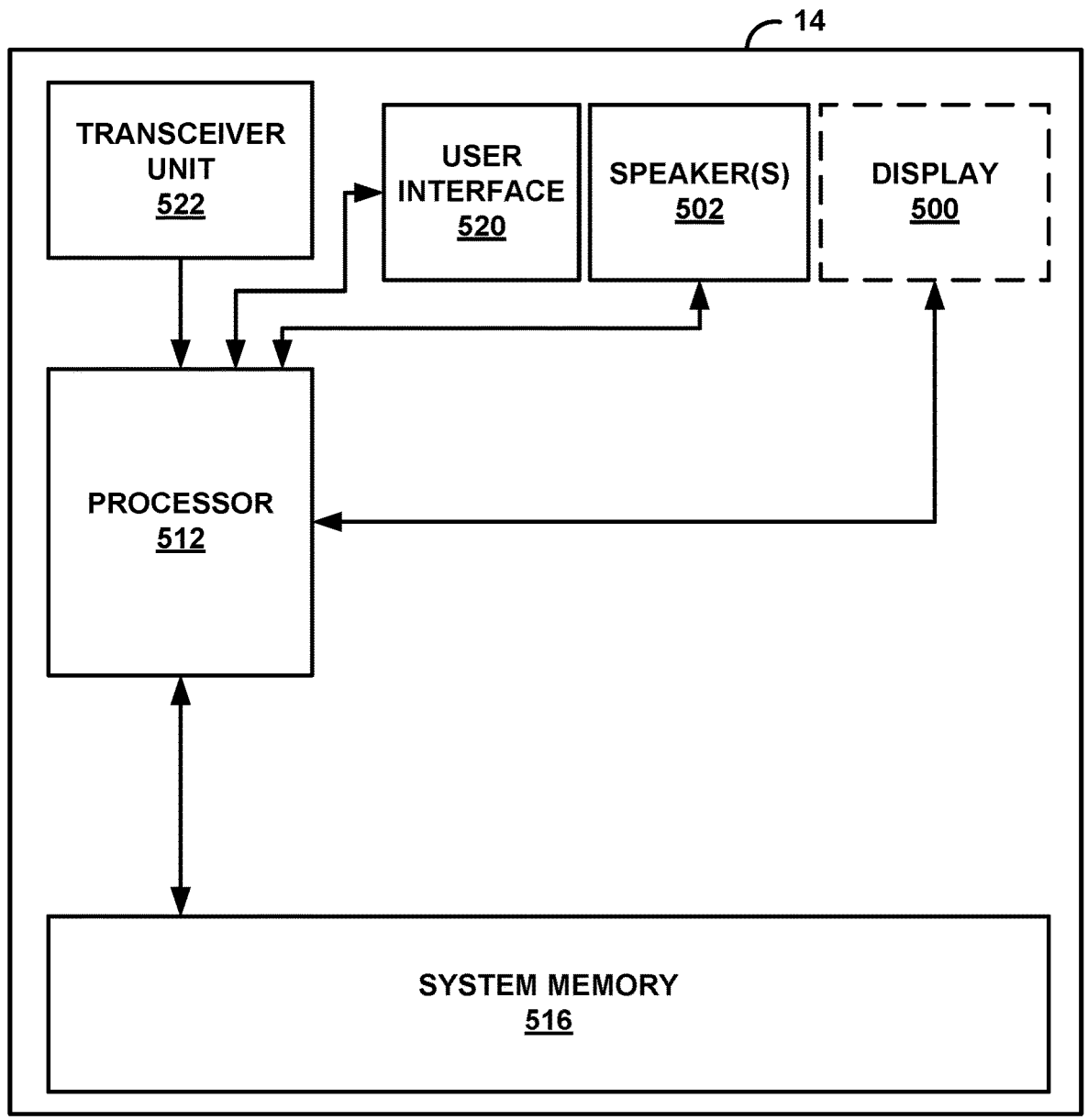
FIG. 16 is a block diagram illustrating exemplary components of the sink device shown in the example of FIG. 1.

FIG. 16 is a block diagram illustrating exemplary components of the sink device 14 shown in the example of FIG. 1. Although the sink device 14 may include components similar to that of the source device 12 discussed above in more detail with respect to the example of FIG. 15, the sink device 14 may, in certain instances, include only a subset of the components discussed above with respect to the source device 12.

In the example of FIG. 16, the sink device 14 includes one or more speakers 502, a processor 512, a system memory 516, a user interface 520, and a transceiver unit 522. The processor 512 may be similar or substantially similar to the processor 412. In some instances, the processor 512 may differ from the processor 412 in terms of total processing capacity or may be tailored for low power consumption. The system memory 516 may be similar or substantially similar to the system memory 416. The speakers 502, the user interface 520, and the transceiver unit 522 may be similar to or substantially similar to the respective speakers 402, user interface 420, and transceiver unit 422. The sink device 14 may also optionally include a display 500, although the display 500 may represent a low power, low resolution (potentially a black and white LED) display by which to communicate limited information, which may be driven directly by the processor 512.

The processor 512 may include one or more hardware units (including so-called "processing cores") configured to perform all or some portion of the operations discussed above with respect to one or more of the wireless connection manager 40, the wireless communication units 42, and the audio decoder 44. The transceiver unit 522 may represent a unit configured to establish and maintain the wireless connection between the source device 12 and the sink device 14. The transceiver unit 522 may represent one or more receivers and one or more transmitters capable of wireless communication in accordance with one or more wireless communication protocols. The transceiver unit 522 may perform all or some portion of the operations of one or more of the wireless connection manager 40 and the wireless communication units 28.

The foregoing techniques may be performed with respect to any number of different contexts and audio ecosystems. A number of example contexts are described below, although the techniques should be limited to the example contexts. One example audio ecosystem may include audio content, movie studios, music studios, gaming audio studios, channel-based audio content, coding engines, game audio stems, game audio coding/rendering engines, and delivery systems.

The movie studios, the music studios, and the gaming audio studios may receive audio content. In some examples, the audio content may represent the output of an acquisition. The movie studios may output channel-based audio content (e.g., in 2.0, 5.1, and 7.1) such as by using a digital audio workstation (DAW). The music studios may output channel-based audio content (e.g., in 2.0, and 5.1) such as by using a DAW. In either case, the coding engines may receive and encode the channel-based audio content based one or more codecs (e.g., AAC, AC3, Dolby True HD, Dolby Digital Plus, and DTS Master Audio) for output by the delivery systems. The gaming audio studios may output one or more game audio stems, such as by using a DAW. The game audio coding/rendering engines may code and or render the audio stems into channel-based audio content for output by the delivery systems. Another example context in which the techniques may be performed comprises an audio ecosystem that may include broadcast recording audio objects, professional audio systems, consumer on-device capture, high-order ambisonics (HOA) audio format, on-device rendering, consumer audio, TV, and accessories, and car audio systems.

The broadcast recording audio objects, the professional audio systems, and the consumer on-device capture may all code their output using HOA audio format. In this way, the audio content may be coded using the HOA audio format into a single representation that may be played back using the on-device rendering, the consumer audio, TV, and accessories, and the car audio systems. In other words, the single representation of the audio content may be played back at a generic audio playback system (i.e., as opposed to requiring a particular configuration such as 5.1, 7.1, etc.), such as audio playback system 16.

Other examples of context in which the techniques may be performed include an audio ecosystem that may include acquisition elements, and playback elements. The acquisition elements may include wired and/or wireless acquisition devices (e.g., microphones), on-device surround sound capture, and mobile devices (e.g., smartphones and tablets). In some examples, wired and/or wireless acquisition devices may be coupled to mobile device via wired and/or wireless communication channel(s).

In accordance with one or more techniques of this disclosure, the mobile device may be used to acquire a soundfield. For instance, the mobile device may acquire a soundfield via the wired and/or wireless acquisition devices and/or the on-device surround sound capture (e.g., a plurality of microphones integrated into the mobile device). The mobile device may then code the acquired soundfield into various representations for playback by one or more of the playback elements. For instance, a user of the mobile device may record (acquire a soundfield of) a live event (e.g., a meeting, a conference, a play, a concert, etc.), and code the recording into various representation, including higher order ambisonic HOA representations.

The mobile device may also utilize one or more of the playback elements to playback the coded soundfield. For instance, the mobile device may decode the coded soundfield and output a signal to one or more of the playback elements that causes the one or more of the playback elements to recreate the soundfield. As one example, the mobile device may utilize the wireless and/or wireless communication channels to output the signal to one or more speakers (e.g., speaker arrays, sound bars, etc.). As another example, the mobile device may utilize docking solutions to output the signal to one or more docking stations and/or one or more docked speakers (e.g., sound systems in smart cars and/or homes). As another example, the mobile device may utilize headphone rendering to output the signal to a headset or headphones, e.g., to create realistic binaural sound.

In some examples, a particular mobile device may both acquire a soundfield and playback the same soundfield at a later time. In some examples, the mobile device may acquire a soundfield, encode the soundfield, and transmit the encoded soundfield to one or more other devices (e.g., other mobile devices and/or other non-mobile devices) for playback.

Yet another context in which the techniques may be performed includes an audio ecosystem that may include audio content, game studios, coded audio content, rendering engines, and delivery systems. In some examples, the game studios may include one or more DAWs which may support editing of audio signals. For instance, the one or more DAWs may include audio plugins and/or tools which may be configured to operate with (e.g., work with) one or more game audio systems. In some examples, the game studios may output new stem formats that support audio format. In any case, the game studios may output coded audio content to the rendering engines which may render a soundfield for playback by the delivery systems.

The mobile device may also, in some instances, include a plurality of microphones that are collectively configured to record a soundfield, including 3D soundfields. In other words, the plurality of microphone may have X, Y, Z diversity. In some examples, the mobile device may include a microphone which may be rotated to provide X, Y, Z diversity with respect to one or more other microphones of the mobile device.

A ruggedized video capture device may further be configured to record a soundfield. In some examples, the ruggedized video capture device may be attached to a helmet of a user engaged in an activity. For instance, the ruggedized video capture device may be attached to a helmet of a user whitewater rafting. In this way, the ruggedized video capture device may capture a soundfield that represents the action all around the user (e.g., water crashing behind the user, another rafter speaking in front of the user, etc.).

The techniques may also be performed with respect to an accessory enhanced mobile device, which may be configured to record a soundfield, including a 3D soundfield. In some examples, the mobile device may be similar to the mobile devices discussed above, with the addition of one or more accessories. For instance, a microphone, including an Eigen microphone, may be attached to the above noted mobile device to form an accessory enhanced mobile device. In this way, the accessory enhanced mobile device may capture a higher quality version of the soundfield than just using sound capture components integral to the accessory enhanced mobile device.

Example audio playback devices that may perform various aspects of the techniques described in this disclosure are further discussed below. In accordance with one or more techniques of this disclosure, speakers and/or sound bars may be arranged in any arbitrary configuration while still playing back a soundfield, including a 3D soundfield. Moreover, in some examples, headphone playback devices may be coupled to a decoder via either a wired or a wireless connection. In accordance with one or more techniques of this disclosure, a single generic representation of a soundfield may be utilized to render the soundfield on any combination of the speakers, the sound bars, and the headphone playback devices.

A number of different example audio playback environments may also be suitable for performing various aspects of the techniques described in this disclosure. For instance, a 5.1 speaker playback environment, a 2.0 (e.g., stereo) speaker playback environment, a 9.1 speaker playback environment with full height front loudspeakers, a 22.2 speaker playback environment, a 16.0 speaker playback environment, an automotive speaker playback environment, and a mobile device with ear bud playback environment may be suitable environments for performing various aspects of the techniques described in this disclosure.

In accordance with one or more techniques of this disclosure, a single generic representation of a soundfield may be utilized to render the soundfield on any of the foregoing playback environments. Additionally, the techniques of this disclosure enable a rendered to render a soundfield from a generic representation for playback on the playback environments other than that described above. For instance, if design considerations prohibit proper placement of speakers according to a 7.1 speaker playback environment (e.g., if it is not possible to place a right surround speaker), the techniques of this disclosure enable a render to compensate with the other 6 speakers such that playback may be achieved on a 6.1 speaker playback environment.

Moreover, a user may watch a sports game while wearing headphones. In accordance with one or more techniques of this disclosure, the soundfield, including 3D soundfields, of the sports game may be acquired (e.g., one or more microphones and/or Eigen microphones may be placed in and/or around the baseball stadium). HOA coefficients corresponding to the 3D soundfield may be obtained and transmitted to a decoder, the decoder may reconstruct the 3D soundfield based on the HOA coefficients and output the reconstructed 3D soundfield to a renderer, the renderer may obtain an indication as to the type of playback environment (e.g., headphones), and render the reconstructed 3D soundfield into signals that cause the headphones to output a representation of the 3D soundfield of the sports game.

In each of the various instances described above, it should be understood that the source device 12 may perform a method or otherwise comprise means to perform each step of the method for which the source device 12 is described above as performing. In some instances, the means may comprise one or more processors. In some instances, the one or more processors may represent a special purpose processor configured by way of instructions stored to a non-transitory computer-readable storage medium. In other words, various aspects of the techniques in each of the sets of encoding examples may provide for a non-transitory computer-readable storage medium having stored thereon instructions that, when executed, cause the one or more processors to perform the method for which the source device 12 has been configured to perform.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media. Data storage media may be any available media that can be accessed by one or more computers or one or more processors to retrieve instructions, code and/or data structures for implementation of the techniques described in this disclosure. A computer program product may include a computer-readable medium.

Likewise, in each of the various instances described above, it should be understood that the sink device 14 may perform a method or otherwise comprise means to perform each step of the method for which the sink device 14 is configured to perform. In some instances, the means may comprise one or more processors. In some instances, the one or more processors may represent a special purpose processor configured by way of instructions stored to a non-transitory computer-readable storage medium. In other words, various aspects of the techniques in each of the sets of encoding examples may provide for a non-transitory computer-readable storage medium having stored thereon instructions that, when executed, cause the one or more processors to perform the method for which the sink device 14 has been configured to perform.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some examples, the functionality described herein may be provided within dedicated hardware and/or software modules configured for encoding and decoding or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various aspects of the techniques have been described. These and other aspects of the techniques are within the scope of the following claims.

What is claimed is:

1. A device configured to decode audio data, the device comprising:
a memory configured to store the audio data; and
one or more processors in communication with the memory, the one or more processors configured to:
decode, from an encoded audio bitstream, a unique identifier for each of a plurality of subbands of audio data;
perform inverse pyramid vector quantization (PVQ) using a compact map to reconstruct a residual vector for each subband of the plurality of subbands of the audio data based on the unique identifier for the respective subband of the plurality of subbands of the audio data, wherein the compact map is generated using structural unification of vectors across subbands and relational compression, and wherein the unique identifiers correspond to codevectors; and
reconstruct, based on the residual vectors and energy scalars for each subband, the plurality of subbands of the audio data.

2. The device of claim 1, wherein the one or more processors are configured to:
refrain from explicitly storing values for tables of the codevectors for each subband.

3. The device of claim 1, wherein, to perform the structural unification, the one or more processors are configured to:
map codevectors from multiple subbands into a plurality of unified codevectors.

4. The device of claim 3, wherein, to perform the relational compression, the one or more processors are configured to:
perform one or both of inter and intra vector compression on the plurality of unified codevectors.

5. The device of claim 1, wherein the one or more processors are configured to:
receive the encoded audio bitstream over a personal area network (PAN) using a PAN communication protocol.

6. The device of claim 5, wherein the PAN communication protocol is a Bluetooth communication protocol.

7. The device of claim 1, further comprising:
one or more loudspeakers, wherein the one or more processors are configured to output the reconstructed audio data to the one or more loudspeakers.

8. The device of claim 7, wherein the one or more processors and the one or more loudspeakers are included in headphones.

9. A device configured to encode audio data, the device comprising:
a memory configured to store the audio data; and
one or more processors in communication with the memory, the one or more processors configured to:
separate the audio data into a plurality of subbands;
generate, for each subband, a respective energy scalar and a respective residual vector;
perform pyramid vector quantization (PVQ) using a compact map to generate a unique identifier for the residual vector in each subband, wherein the compact map is generated using structural unification of vectors across subbands and relational compression, and wherein the unique identifiers correspond to codevectors; and encode, in an encoded audio bitstream, the generated unique identifier for each subband.

10. The device of claim 9, wherein the one or more processors are configured to:
refrain from explicitly storing values for tables of the codevectors for each subband.

11. The device of claim 9, wherein, to perform the structural unification, the one or more processors are configured to:
map codevectors from multiple subbands into a plurality of unified codevectors.

12. The device of claim 11, wherein, to perform the relational compression, the one or more processors are configured to:
perform one or both of inter and intra vector compression on the plurality of unified codevectors.

13. The device of claim 9, wherein the one or more processors are configured to:
cause a transmitter to transmit the encoded audio bitstream over a personal area network (PAN) using a PAN communication protocol.

14. The device of claim 13, wherein the PAN communication protocol is a Bluetooth communication protocol.

15. The device of claim 9, wherein the one or more processors are configured to:
perform a frequency domain transformation on the audio data to create frequency domain audio data; and
filter the frequency domain audio data to separate the audio data into the plurality of subbands.

16. The device of claim 9, further comprising:
one or more microphones configured to generate the audio data.

17. A method comprising:
decoding, from an encoded audio bitstream, a unique identifier for each of a plurality of subbands of audio data;
performing inverse pyramid vector quantization (PVQ) using a compact map to reconstruct a residual vector for each subband of the plurality of subbands of the audio data based on the unique identifier for the respective subband of the plurality of subbands of the audio data, wherein the compact map is generated using structural unification of vectors across subbands and relational compression, and wherein the unique identifiers correspond to codevectors; and
reconstructing, based on the residual vectors and energy scalars for each subband, the plurality of subbands of the audio data.

18. The method of claim 17, further comprising:
refraining from explicitly storing values for tables of the codevectors for each subband.

19. The method of claim 17, wherein performing the structural unification comprises:
mapping codevectors from multiple subbands into a plurality of unified codevectors.

20. The method of claim 19, wherein performing the relational compression comprises:
performing one or both of inter and intra vector compression on the plurality of unified codevectors.

21. A method comprising:
separating audio data into a plurality of subbands;
generating, for each subband, a respective energy scalar and a respective residual vector;
performing pyramid vector quantization (PVQ) using a compact map to generate a unique identifier for the residual vector in each subband, wherein the compact map is generated using structural unification of vectors across subbands and relational compression, and wherein the unique identifiers correspond to codevectors; and
encoding, in an encoded audio bitstream, the generated unique identifier for each subband.

22. The method of claim 21, further comprising:
refraining from explicitly storing values for tables of the codevectors for each subband.

23. The method of claim 21, wherein performing the structural unification comprises:
mapping codevectors from multiple subbands into a plurality of unified codevectors.

24. The method of claim 23, wherein performing the relational compression comprises:
performing one or both of inter and intra vector compression on the plurality of unified codevectors.

25. The method of claim 21, further comprising:
performing a frequency domain transformation on the audio data to create frequency domain audio data; and
filtering the frequency domain audio data to separate the audio data into the plurality of subbands.

* * * * *